(12) United States Patent
Itoh et al.

(10) Patent No.: US 7,972,712 B2
(45) Date of Patent: Jul. 5, 2011

(54) ORGANIC ELECTROLUMINESCENT DEVICE AND METHOD FOR PRODUCING THE SAME

(75) Inventors: Kiyoshi Itoh, Tokyo-to (JP); Kimihisa Yamamoto, Kanagawa (JP); Jun-Sang Cho, Kanagawa (JP); Atsushi Kimoto, Kanagawa (JP)

(73) Assignee: Dai Nippon Printing Co., Ltd., Tokyo-to (JP)

( * ) Notice: Subject to any disclaimer, the term of this patent is extended or adjusted under 35 U.S.C. 154(b) by 819 days.

(21) Appl. No.: 11/661,409

(22) PCT Filed: Aug. 30, 2005

(86) PCT No.: PCT/JP2005/016172
§ 371 (c)(1),
(2), (4) Date: Aug. 14, 2007

(87) PCT Pub. No.: WO2006/025554
PCT Pub. Date: Mar. 9, 2006

(65) Prior Publication Data
US 2008/0024054 A1    Jan. 31, 2008

(30) Foreign Application Priority Data

Aug. 31, 2004   (JP) ................................. 2004-253595

(51) Int. Cl.
*H01L 51/54* (2006.01)
(52) U.S. Cl. .................. 428/690; 313/504; 544/165
(58) Field of Classification Search .................. 428/690; 313/504; 544/165
See application file for complete search history.

(56) References Cited

U.S. PATENT DOCUMENTS
2003/0064248 A1   4/2003  Wolk et al.

FOREIGN PATENT DOCUMENTS
JP   2003-231692        8/2003
JP   2003-267976   *   9/2003
WO  WO 03/079736   *   9/2003
WO  WO 2005/059951    6/2005

OTHER PUBLICATIONS

Kimoto, et. al., Synthesis . . . Carbazole . . . Phenylazomethine Dendron, 2004, Macromolecules, vol. 37, pp. 5531-5537.* Lo, Shih-Chun, et al. (2002) "Green Phosphorescent Dendrimer for Light-Emitting Diodes." Advanced Materials, Wiley-VCH Verlag GmbH. vol. 14. No. 13-14. pp. 975-979.
"Kanagawa Academy of Science and Technology (KAST) Summary of Studies in 2001." KAST, 2002. pp. 101-116.
Yamamoto, et al. (2002). "Stepwise radial complexation of imine groups in phenylazomethine dendrimers." Letters to Nature. vol. 415. pp. 509-511 (and cover page).
Kimoto, et al. (2004). "Novel Carbazole Dendrimers Having a Metal Coordination Site as a Unique Hole-Transport Material". Macromol. Symp. 209. Verlag GmbH. pp. 51-65.

* cited by examiner

*Primary Examiner* — D. Lawrence Tarazano
*Assistant Examiner* — Gregory Clark
(74) *Attorney, Agent, or Firm* — Ladas & Parry LLP

(57) ABSTRACT

An organic EL device capable of being produced by a wet film forming method in which all processes can be conducted consistently under an inert atmosphere for efficiently forming a predetermined pattern without using any aqueous or acidic material. The device includes an organic layer between an anode and a cathode, the anode and the cathode facing each other, and the organic layer containing at least a light emitting layer. At least one layer composing the organic layer is a cured film having a predetermined pattern and containing a cured dendrimer material having one or more photoreactive functional groups at the ends thereof. The organic electroluminescent device is produced by: forming a dendrimer material layer, as at least one layer composing the organic layer, from a coating liquid containing a dendrimer material having one or more photoreactive functional groups at the ends thereof and an organic solvent; and pattern-exposing the dendrimer material layer.

20 Claims, 2 Drawing Sheets

ORGANIC ELECTROLUMINESCENT DEVICE AND METHOD FOR PRODUCING THE SAME

TECHNICAL FIELD

The present invention relates to an organic electroluminescent device excellent in a luminescence property (hereinafter may be referred to as "organic EL device") and a method for producing the organic EL device.

BACKGROUND ART

The organic EL device is a charge injection type self emitting device utilizing the light emission generated at the time of recombining an electron and a positive hole reaching at a light emitting layer. Such an organic EL device has been developed actively since 1987 when T. W. Tang, et al. proved that an device comprising laminated thin films of a fluorescent metal chelate complex and a diamine based molecule emits a light of a high luminance with a low driving voltage.

The device configuration of the organic EL device basically comprises cathode/organic layer/anode. The organic layer thereof in general has a two layer structure comprising a light emitting layer and a positive hole injection layer, or a three layer structure comprising an electron transporting layer, a light emitting layer and a positive hole transporting layer. In the organic EL device, it is necessary to supply charges (a positive hole and an electron) to a light emitting material to be the luminescent center efficiently and quickly. For that purpose, a charge transporting material is contained in the light emitting layer, or a positive hole transporting layer is disposed between the anode and the light emitting layer, or an electron transporting layer is disposed between the cathode and the light emitting layer.

Such a light emitting layer and the charge (positive hole, electron) transporting layer, the charge injecting layer and so on, which are formed adjacent to the light emitting layer as occasion demands, are typically formed by a vacuum deposition method. In a vapor deposition method such as the vacuum deposition or the like, however, there are problems that a large scale deposition apparatus is required and a cost thereof is expensive. Furthermore, there is another problem of difficulty in application for a large surface area of a substrate. In order to solve these problems, there is proposed an organic EL device in which the light emitting layer or the charge transporting layer is formed by a wet film forming method (a spin coating method, a printing method, an ink jet method, etc.) in which an organic compound having a light emitting property, a charge transporting property or the like is dissolved or dispersed in a solvent and applied onto a substrate. The wet film forming method using a solvent for an application to a substrate has merits including the following facts that a large scale deposition apparatus is not required, a production process can be simplified, a material can be utilized efficiently, a cost is low, and the process can be applied to a large surface area of a substrate, in comparison with the vacuum deposition method.

On the other hand, a dendrimer is a new type polymer having a highly branched structure, which is proposed by Tomalia et al. on 1984. Owing to its structure in which many branches extend from a "core" which is a center of the molecule, it is also called a dendritic polymer. It is understood that, since branched-chains extend outside of the core in the form of layers (these layers are called "generations"), the density of the branches is higher toward the outside, so that the structure can capture a metal ion or the like inside of the dendrimer as a molecule capsule, or an electron or energy migration from the outside into the core can be induced.

As an example of an application of the dendrimer to the organic EL device, there is disclosed a method of applying a solution mixture of a low molecular host and a low molecular phosphorescent guest arranged at a center of a conjugated dendrimer (e.g. S.-C. Lo et al., Adv. Mater., (2002), vol. 14, No. 13-14, p. 975-979). Furthermore, there is also disclosed a method of using a multi-functioned dendrimer in which a low molecular phosphorescent guest is arranged at a center of the dendrimer and at least a part of branches (dendrons) has a host material (e.g. Japanese Patent Application Laid-Open No. 2003-231692). Furthermore, in a document, "Nature", (2002), Vol. 415, p. 509-511, there is disclosed a phenyl azomethine dendrimer comprising an azomethine structure having a high coordinating property to metal ions, and in a document titled "Kanagawa Academy of Science and Technology (KAST) Summary of Studies in 2001", KAST, 2002, p 101-116, there is disclosed an organic EL device using a phenyl azomethine dendrimer.

DISCLOSURE OF INVENTION

In order to produce an organic EL device by a coating method, it is typical that an aqueous dispersion of polyethylene dioxy thiophene—polystylene sulfonate (hereinafter referred to as "PEDOT:PSS") is conventionally used for a positive hole injecting transporting layer, which is formed by applying the dispersion and dried. However, this material involves the following problems, that is, (1) since this material is used by dissolving or dispersing into water, residual water remains in an obtained film even after dried, which may adversely affect on an EL luminescence life or the like, (2) although other constitutional layers, which can be made of non-aqueous materials, can be formed under inert atmosphere such as in a glove box, the layer of PEDOT:PSS, which is aqueous material, can not be formed under inert atmosphere such as in a glove box, and thereby the whole process can not performed under inert atmosphere, (3) since PEDOT: PSS is a strong acidic material, a coating apparatus is required to be subjected to an acid resistant treatment, and an underlayered anode material may be eroded, which may also adversely affect on a light emitting property. For these reasons, there is a need for a material which can substitute for PEDOT:PSS.

The reason why PEDOT: PSS is conventionally used in producing the organic EL device by a coating method is owing to that PEDOT:PSS has a certain extent of positive hole injecting transporting function and owing to that PEDOT:PSS is an aqueous material so that a non-aqueous (soluble in an organic solvent) light emitting layer is easily formed over it. Therefore, a material which can substitute for PEDOT:PSS is required to have a positive hole injecting transporting function and required that a light emitting material ink soluble in an organic solvent can be applied and then formed as a film on such a substitute material.

As the material having such properties, there are conventionally proposed: a positive hole injecting transporting material soluble in an organic solvent, such as polyvinyl carbazole, polythiophene, triarylamine and so on. However, since these materials are materials soluble in an organic solvent, an underlayered positive hole injecting transporting layer is inevitably eluted out when the light emitting layer soluble in an organic solvent is stacked, in some extent. Thereby, the EL light emitting properties of these substitution materials is inferior to that of PEDOT:PSS material. The reason of this is considered that an interface between the positive hole injecting transporting layer and the overlayered light emitting layer is not clearly defined in these materials soluble in an organic solvent, and a phase-solution and/or phase-mixture is caused at the interface, and thereby the charge transfer can not performed uniformly and sufficiently. Furthermore, the extent of phase-solution or mixture at the interface can be varied depending on a temperature or a manufactured environmental atmosphere, resulting in the difficulty of reproducing a certain capability or function.

In the document titled "Kanagawa Academy of Science and Technology (KAST) Summary of Studies in 2001", KAST, 2002, p 101-116, there is disclosed an organic EL device using a phenyl azomethine dendrimer for a positive hole transporting layer. Nevertheless, since the phenyl azomethine dendrimer is soluble in an organic solvent, it may cause an elution of the underlayered positive hole transporting layer, when the light emitting layer soluble in an organic solvent is stacked thereon. For this reason, the light emitting layer is formed by a deposition method.

Furthermore, as a patterning method for causing a light emission as a predetermined pattern, or for forming multi-colored light emitting layers, there are conventionally proposed a method of forming a layer at a desired position by an ink jet method or a printing method, or a photolithography method using a further photosensitive composition. Nevertheless, there is a need for other patterning methods, because the above-mentioned method each involves a problem of complexity of the apparatus or process to be used.

The present invention has been accomplished in view of above problems. It is therefore an object of the present invention to provide an organic EL device, capable of being produced by a wet film forming method in which all processes can be conducted consistently under inert atmosphere for efficiently forming a predetermined pattern without using any aqueous or acidic material, and excellent in device properties such as a light emitting property, an device lifetime and so on. It is also an object of the present invention to provide a method for producing such an organic EL device.

The above object of the present invention is achieved by an organic electroluminescent device comprising an organic layer between an anode and a cathode, the anode and the cathode facing each other, and the organic layer containing at least a light emitting layer, wherein at least one layer composing the organic layer is a cured film having a predetermined pattern and containing a cured dendrimer material having one or more photoreactive functional groups at the ends thereof.

The above object of the present invention is achieved by a method for producing an organic electroluminescent device comprising an organic layer between an anode and a cathode, the anode and the cathode facing each other, and the organic layer containing at least a light emitting layer, comprising steps of: forming a dendrimer material layer, as at least one layer composing the organic layer, from a coating liquid containing a dendrimer material having one or more photoreactive functional groups at the ends thereof and an organic solvent; and pattern-exposing the dendrimer material layer.

In the present invention, since the dendrimer material having one or more photoreactive functional groups at the ends thereof is used, it can be applied with use of an organic solvent, and a coated film formed by using the dendrimer material can be cured by a light radiation. Thereby, without using any aqueous or acidic material, the organic layer of the organic EL device can be formed consistently under inert atmosphere by a wet film forming method. The cured film containing the cured dendrimer material having one or more photoreactive functional groups at the ends thereof decreases the solubility to an organic solvent and thereby does not cause a phase-solution and/or phase-mixture at the interface, even if an organic layer ink soluble in an organic solvent is applied over the cured film. Therefore, an organic layer soluble in an organic solvent can be formed over the cured film to form a layered structure.

Also, in the present invention, owing to the photosensitivity of the dendrimer material having one or more photoreactive functional groups at the ends thereof, it is possible to conducting a patterning to a desired pattern by irradiating only a desired portion with a light. Thereby, there is no need of a special apparatus as involved in an ink jet method or a printing method, and no need of a complicated processes involving a development with another photosensitive composition. Thereby, it is possible to effectively obtain the organic layer, including a positive hole injecting transporting layer, a light emitting layer, an electron injecting transporting layer and so on, having a desired pattern only at a necessary portion. For example, in order to produce an organic EL display panel, it is required that edges of the positive hole injecting transporting layer are wiped off, for a convenience of a sealing process. Nevertheless, by employing the patterning technique according to the present invention, it is possible to easily leave a part other than the edges.

Furthermore, in the present invention, since the dendrimer material having one or more photoreactive functional groups at the ends thereof is employed, it is possible to obtain an organic EL device excellent in device properties such as a light emitting property, an device lifetime and so on. Because the material has a superior charge transporting injecting function and a light emitting function, and furthermore the device employing such a material can be formed consistently under inert atmosphere.

In the organic electroluminescent device according to the present invention, the organic layer comprising the cured film is preferably a positive hole injecting transporting layer, in view of obtaining an organic EL device having a good device property and the aforementioned merits.

In an organic electroluminescent device according to the present invention, the cured film is produced preferably by forming a dendrimer material layer from a coating liquid which contains a dendrimer material having one or more photoreactive functional groups at the ends thereof and an organic solvent, and pattern-exposing the dendrimer material layer.

In the present invention, the pattern-exposing process is preferably conducted by using a light to which the photoreactive functional groups are reactive, because the photoreactive functional groups react to decrease the solubility to a solvent at the exposed portion of the dendrimer material layer, so that a patterning becomes possible.

In the present invention, after the pattern-exposing process using a light to which the photoreactive functional groups contained in the dendrimer material are reactive, an unexposed portion is preferably removed, in view of leaving a desired pattern.

In the present invention, after the pattern-exposing process using a light to which the photoreactive functional groups contained in the dendrimer material are reactive, a solvent developing is preferably conducted, in view of utilizing a difference of solubility between the exposed portion and the unexposed portion.

In the present invention, the dendrimer material having one or more photoreactive functional groups at the ends thereof preferably has one or more carbazole groups as an end group, because the carbazole group itself has a charge transporting property and is a photoreactive functional group, and thereby eliminating a need for other components for initiating a photoreaction such as a polymerization initiator.

In the present invention, the dendrimer material having one or more photoreactive functional groups at the ends thereof preferably has one or more sites to which one or more metals coordinate, in view of providing or improving the charge transporting property or the light emitting property.

The dendrimer material having one or more photoreactive functional groups at the ends thereof is preferably an azomethine dendrimer material having one or more carbazole groups. Because a superior charge injecting transporting layer and/or the light emitting layer can be obtained by a coating method, and other components for initiating a photoreaction such as a polymerization initiator is not required.

EFFECT OF INVENTION

The organic EL device and the production method thereof allows producing an device by a wet film forming method in which all processes can be conducted consistently under inert atmosphere for efficiently forming a predetermined pattern without using any aqueous or acidic material, and are excellent in device properties such as a light emitting property, an device lifetime and so on.

According to the present invention, an organic layer such as a positive hole injecting transporting layer, a light emitting layer, an electron injecting transporting layer, or the like, having a desired pattern only at a necessary portion can be obtained efficiently. For example, in order to produce an organic EL display panel, it is required that edges of the positive hole injecting transporting layer are wiped off, for a convenience of a sealing process. Nevertheless, by employing the patterning technique according to the present invention, it is possible to easily leave a portion other than the edges.

The production method of the present invention allows a simple and low cost production, in comparison with a conventional patterning method by a deposition method, because a vacuum system and the like involving an alignment mechanism is not required. On the other hand, in comparison with a patterning method by an ink jet method, the present invention has an advantage that a structure for assisting a patterning, a pre-treatment for a substrate, or the like is not required. Further, the production method of the present invention is a preferable method for forming a highly minute and precise pattern in view of a discharge accuracy of an ink jet head. Furthermore, in comparison with the photolithography using a further photosensitive composition, the present invention allows a further simplified and lower cost production, because the present invention utilizes a photosensitivity of the positive hole injecting transporting layer itself and thereby requires no dry etching technique, resulting in simplified processes. Therefore, according to the production method of the organic EL device of the present invention, an organic EL device having a highly minute and precise pattern can be obtained relatively easily and at a low cost.

In the organic EL device of the present invention, at least one layer composing the organic layer is made of a cured film having a predetermined pattern. Thereby, a luminescence can be obtained at the predetermined pattern. For example, a luminescence can be obtained at a predetermined pattern including a letter or design.

Furthermore, the organic EL device of the present invention allows a multi-colored luminescence, if the light emitting layer composing the organic layer employs a cured film having a predetermined pattern and including a cured dendrimer material having one or more photoreactive functional groups at the ends thereof. That is, according to the present invention, it is easy to obtain a multi-colored luminescence, because a multi-color patterning can be realized, for example, by forming firstly a pattern for red color, then forming a pattern for green color, and then forming a pattern for blue color, and then a pattern for another color, and thereby another special method for color coding is not required.

According to the present invention, since the dendrimer material having one or more photoreactive functional groups at the ends thereof is employed, it is possible to obtain an organic EL device excellent in device properties such as a light emitting property, an device lifetime and so on. Because the material has a superior charge transporting injecting function and a light emitting function, and furthermore the device employing such a material can be formed consistently under inert atmosphere.

As mentioned above, the present invention is a very advantageous technology, in view of the production process and the properties of the device.

BEST MODE FOR CARRYING OUT THE INVENTION

Hereinafter, a further detail explanation will be made on the organic EL device of the present invention and the production method thereof.

Incidentally, a light used for causing a photoreaction in the present invention includes not only an electromagnetic wave having a wave length in visible or non-visible region, but also a corpuscular beam such as an electron beam, and a radiation beam or an ionizing radiation beam generically referring to the electromagnetic wave and the corpuscular beam. From among, the electromagnetic wave, the electron beam, the ionizing radiation beam and the like whose wave length is 2 µm or less are typically used. The light used for causing a photoreaction in the present invention is preferably an UV ray or the electron beam, in view of forming highly minute and precise pattern.

A. Organic Electroluminescent Device

The organic EL device of the present invention is an organic electroluminescent device comprising an organic layer between an anode and a cathode, the anode and the cathode facing each other, and the organic layer containing at least a light emitting layer, in which at least one layer composing the organic layer is made of a cured film having a predetermined pattern and containing a cured material of a dendrimer material having one or more photoreactive functional groups at the ends thereof.

Figure 1:
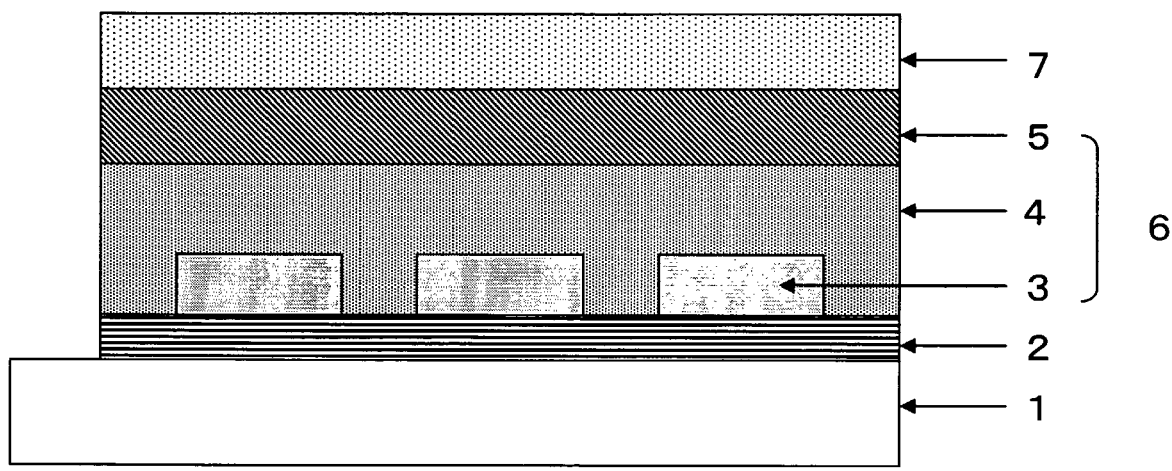
FIG. 1 is a sectional view indicating an example of an organic EL device of the present invention.
Figure 2:
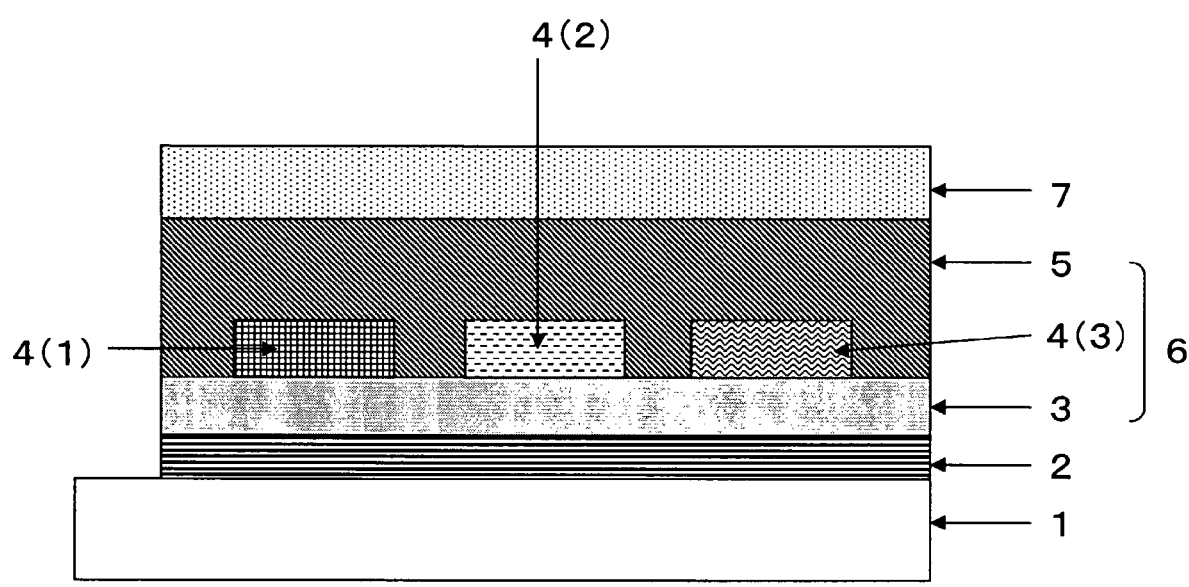
FIG. 2 is a sectional view indicating another example of an organic EL device of the present invention.

First of all, the organic EL device of the present invention will be explained, with reference to drawings. FIGS. 1 and 2 each is a schematic view of a basic structure indicating an embodiment of the organic EL device of the present invention, respectively. In FIGS. 1 and 2, the organic EL device is provided with: a substrate 1; an anode 2; an organic layer 6 including at least a light emitting layer 4 and further including a positive hole injecting transporting layer 3 and an electron injecting transporting layer 5; and a cathode 7, these layers sequentially formed on the substrate 1. FIG. 1 illustrates an embodiment of the organic EL device of the present invention, in which the positive hole injecting transporting layer 3 is made of the cured film having the predetermined pattern and containing the cured material of the dendrimer material having one or more photoreactive functional groups at the ends thereof. FIG. 2 illustrates an embodiment of the organic EL device of the present invention in which the light emitting layer 4 is made of the cured film having the predetermined pattern and the cured material of the dendrimer material having one or more photoreactive functional groups at the ends thereof. Incidentally, the predetermined pattern shown in the drawings is an example and not intended to be exhaustive nor limiting of the invention. The predetermined pattern may be a pattern for leaving a part or parts other than the edges, as mentioned above.

Now, each structure of each part of such an organic EL device will be explained.

1. Organic Layer

The organic layer of the organic EL device of the present invention are formed between the anode 2 and the cathode 7, as mentioned below.

The organic layers composing the organic EL device of the present invention is provided with one or more layers including at least the light emitting layer 4. The layers to be formed as the organic layers besides the light emitting layer may be the charge injecting transporting layer such as the positive hole injecting transporting layer 3 and the electron injecting transporting layer 5. In an example of FIG. 1, the charge injecting transporting layer is independent of the light emitting layer, but the light emitting layer 4 may act also as the charge injecting transporting layer.

Incidentally, the positive hole injecting transporting layer of the present invention may have either one of a positive hole injecting layer provided with a function of injecting a positive hole injected from the anode 2 into the light emitting layer 4 stably when electric field is impressed, and a positive hole transporting layer provided with a function of transporting the positive hole injected from the anode 2 into the light emitting layer 4 by the aid of the electric field, or may have both function of the positive hole injecting layer and the positive hole transporting layer.

Moreover, the electron injecting transporting layer may have either one of an electron injecting layer provided with a function of injecting an electron injected from the cathode 7 into the light emitting layer 4 stably when electric field is impressed, and an electron transporting layer provided with a function of transporting the electron injected from the cathode 7 into the light emitting layer 4 by the aid of the electric field, or may have both function of the electron injecting layer and the electron transporting layer.

In the present invention, at least one layer composing the organic layer is made of the cured film having the predetermined pattern and containing the cured material of the dendrimer material having one or more photoreactive functional groups at the ends thereof.

<Dendrimer Material Having One or More Photoreactive Functional Groups at the Ends Thereof>

The dendrimer material used in the present invention is a dendrimer or dendritic polymer having a basic structure represented by the following formula (1).

Formula (1):

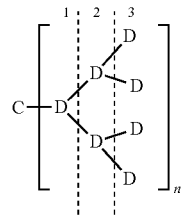

In the formula (1), C is a core (center) molecule, and D is a branched component three-dimensionally surrounding the core molecule. Each D may be the same or different, but preferably the same. Even if each D is different, each D of the same generation is preferably the same. The branched number "n" from the core molecule itself is preferably 2 or more. Also, in the above formula, D shown in bracket representing one branch exemplifies 3 (three generations) as the branching multiplicity from the core. However, branching multiplicity from the core has no upper limitation, insofar as it is 1 (one generation) or more and within a synthesizable range. Incidentally, the branched number "n" from the core molecule itself may be 1, insofar as the branching multiplicity from the core is 2 (two generations) or more. The molecular weight of the dendrimer used in the present invention is preferably 1500 or more, more preferably 3500 or more.

The basic structure of the dendrimer material used in the present invention is shown by the above formula. However, another component other than the core (center) molecule or the branched component D surrounding the core molecule may be included in the dendrimer material. For example, one or more photoreactive functional groups located at the ends thereof, as explained below, and one or more metals or the like bonded at coordinated sites of the dendrimer material may be included.

The dendrimer material used in the present invention has one or more photoreactive functional groups at the ends thereof. The one or more photoreactive functional groups may be present at a part of ends or at all ends respectively in the dendrimer material. The "end" herein means a part which causes an interaction with another "end", in the case that dendrimer material molecules are adjacent to each other. If the dendrimer material is spherical, the end is the outermost part from the core molecule C. For example, if the branched number of times from the core is 3 times (three generations), the end corresponds to the third generation of the branched component D. If the dendrimer material is a fan-like shape, the end is not limited to the outermost part from the core molecule C, but may be another part which can cause an interaction with another end in the case that the dendrimer material molecules are adjacent to each other. In this case, for example, the end may be the core molecule C. Furthermore, "having the photoreactive functional group at the end" may be, for example, a case that the branched component D itself located at the end is the photoreactive functional group, or may be a case that the photoreactive functional group is contained at an end of the branched component D located at the end, or may be a case that the photoreactive functional group is added to the branched component D located at the end.

Each of photoreactive functional groups may be the same or different, insofar as they are photoreactive functional groups bondable to each other by a radiation of light. The photoreactive functional group may be, for example, a group whose reaction is promoted by a reaction scheme including a polymerization reaction such as a photo radical polymerization, a photo cationic polymerization, and a photo anionic polymerization; a polymerization via dimerization; and so on.

For example, the photoreactive functional group may be a carbazole group requiring no initiator. Moreover, for example, it may be a functional group having an ethylenically unsaturated bond (preferably ethylene double bond) such as an acryloyl group, a methacryloyl group, a vinyl group, vinyl cycloalkyl group, an aryl group and so on. Furthermore, for example, it may be a cyclic ether group such as an epoxy group, an oxetanyl group, and so on, a thioether group, and a vinyl ether group. Furthermore, the polymerizing reactive group involving a photo dimerization without any initiator may be, for example, a cinnamate vinyl group or an azo group. Among them, the carbazole group is especially preferable. Because the carbazole group itself has a charge transporting ability, so that it can be used in a branched component, and another component for initiating the photoreaction, such as a polymerization initiator, is not needed.

Some kinds of the photoreactive functional group may need a reaction initiator. In this case, the reaction initiator may be included in a coating liquid for forming the organic layer, or may be incorporated in a dendrimer molecule, as appropriate.

Furthermore, the dendrimer material used in the present invention preferably has one or more sites to which one or more metals coordinate. Owing to these sites allowing a coordinate bond with a metal, the metal can be coordinated and incorporated within the dendrimer stably. The metal incorporated within the dendrimer can improve the charge injection efficiency, or can provide the light emitting property.

The site allowing the coordination bond with the metal may be specifically an imino group, an amino group, an imide group, an amide group and so on. Among them, the imino group is preferable, in view of the stability of the dendrimer itself and/or metal coordination compound.

Furthermore, the site allowing the coordination bond with the metal acts as an electron donating group or an electron attracting group. Thereby, if each of these functional groups is disposed at each generation of the dendrimer, for example, in the case that the disposed functional group acts as an electron donating group, since the electron density of the electron donating group is increased toward the inner generation, a gradient of electron density of the site allowing the coordination bond with the metal may be generated in the molecule. If the electron density of the site allowing the coordination bond with the metal of an inner generation is high in the molecule, the metal can coordinate to form a complex sequentially from the innermost generation. Thus, the charge transporting property and/or the light emitting property can be controlled, by selecting and combining appropriately the kind of the site allowing the coordination bond with the metal, and/or the position and the number of the site in the dendrimer molecule.

In an embodiment of providing the light emitting property and/or the charge injecting transporting property to the dendrimer used in the present invention, there are (1) a first embodiment of incorporating a light emitting structural unit and/or a charge injecting transporting structural unit into the core molecule C or the branched component D surrounding the core molecule, and thereby providing the light emitting property and/or the charge injecting transporting property, (2) a second embodiment of disposing the site allowing the coordination bond with the metal within the dendrimer having the charge transporting property, so that the metal is coordinated and the coordinated or incorporated metal provides the light emitting property and/or the charge injecting transporting property, and a third embodiment of providing the light emitting property and/or the charge injecting transporting property by combining the aforementioned (1) and (2).

In the first or third embodiment, the charge transporting structural unit incorporated within the dendrimer used in the present invention can be used by appropriately selecting a low molecular organic material from materials capable of being used for the charge injecting transporting layer of an organic EL device. For example, it is possible to use a positive hole transporting material selected from an aromatic tertiary amine derivative such as carbazole, triphenyl amine, pyrazolline and so on, starburst polyamines and a phthalocyanine metallic complex derivative; an electron transporting material selected from an alminoquinolinol complex derivative, an oxadiazole derivative, a triazole derivative, a triadine derivative, and a phenyl quinoxaline; and a positive hole/electron transporting material selected from a carbazole biphenyl derivative.

More specifically, the charge transporting structural unit may be a unit represented by the following formula.

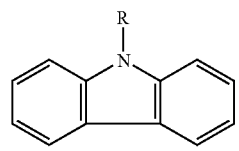

(b-1)

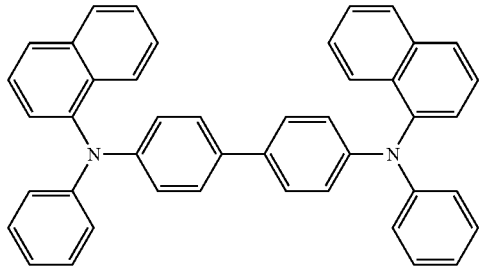

(b-2)

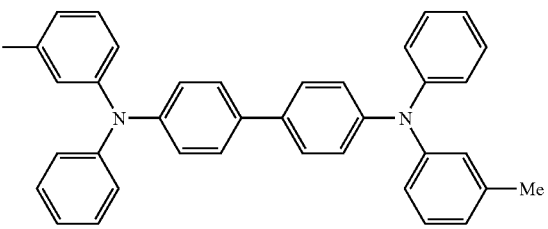

(b-3)

wherein R of a formula (b-1) is a linkage group of the dendrimer, not limited to any special group, but may be a direct bond, an aryl group, an alkyl group and so on, specifically phenyl group and the like.

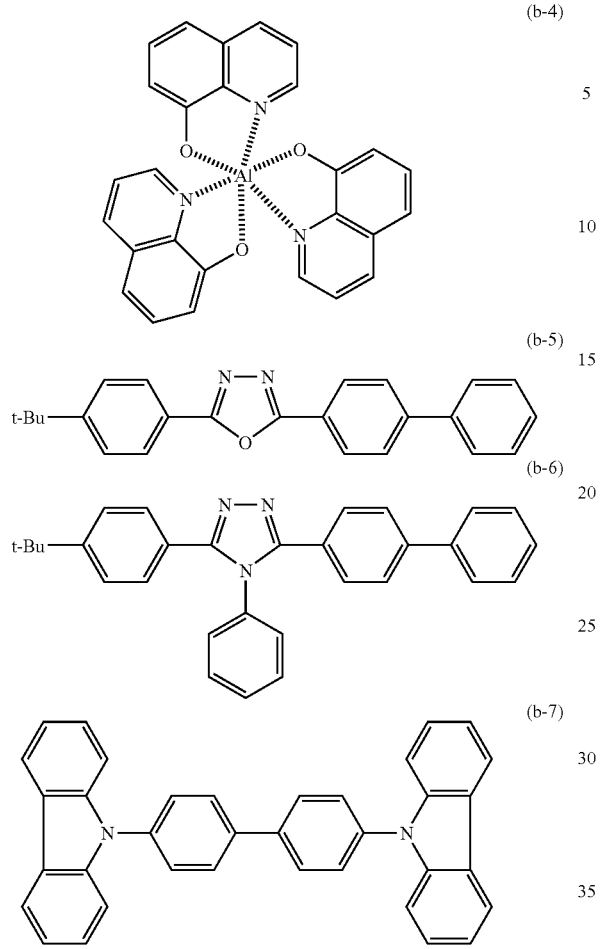
(b-4)
(b-5)
(b-6)
(b-7)

The charge transporting structural unit may be a known material as a charge injecting transporting material, or may further include a structure providing a charge transporting property. For example, the unit may further include a structure having a conjugated system, specifically an aromatic ring such as an aromatic hydrocarbon ring, a hetero ring, and a condensed ring thereof, or an unsaturated bond and so on. Furthermore, these structure may be included in the dendrimer material, via an organic group of monovalent or more, an atom, or a linkage group which is an organic group of divalent or more capable of bonding these structures, insofar as the charge transporting property is not deteriorated.

In the first or third embodiment, the light emitting structural unit incorporated within the dendrimer material used in the present invention can be used by appropriately selecting a low molecular organic material or an organic metallic complex from materials capable of being used for the light emitting layer of an organic EL device. For example, it is possible to use a fluorescent light emitting colorant such as a coumarin derivative, a quinolidine derivative, a quinacridone derivative, a pyrrolopyrrole derivative, a polycyclic aromatic hydrocarbon, a styryl benzene derivative, a polymethine derivative and xanthene derivative; a fluorescent metallic complex such as a quinolinol complex derivative, a quinoline complex derivative, a hydroxy phenyl oxazole, a hydroxy phenyl thiazole and an azomethine metallic complex derivative; or a phosphorescent transition metal complex such as an iridium complex derivative or a platinum complex derivative.

More specifically, the light emitting structural unit may be a unit represented by the following formula.

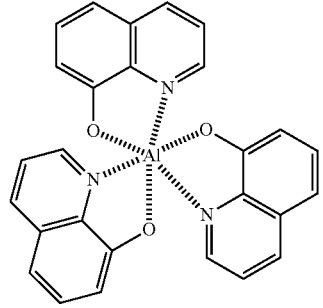
(e-1)

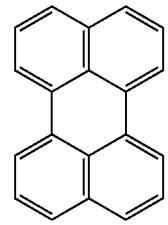
(e-2)

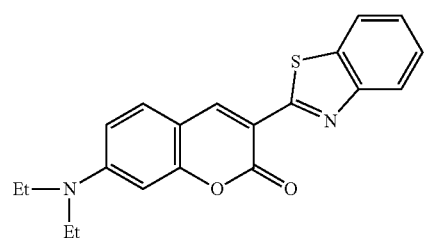
(e-3)

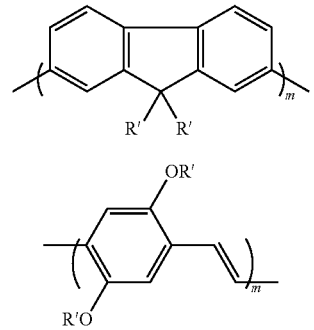
(e-4)

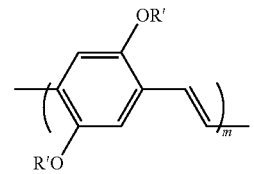
(e-5)

wherein each R' of the formulae (e-4) and (e-5) may be the same of different, and may be an alkyl group or an organic group including an alkyl group, and "m" is 1 or a natural number more than 1.

In the second or third embodiment, in which the metal incorporated within the dendrimer material used in the present invention provides or improves the positive hole injecting transporting, the metal preferably has a large work function, in view of the positive hole injecting efficiency. A metal whose work function is 4.2 eV or more is preferably used. The metal whose work function is 4.2 eV or more may be Ag, Al, Au, Be, Bi, Co, Cr, Cu, Fe, Ga, Ir, Mo, Nb, Ni, Os, Pb, Pd, Pt, Sb, Sn, Ti, V and W. Especially, Sn is preferable, in view of the stability and a lower cost.

On the other hand, in the second or third embodiment, in which the metal incorporated within the dendrimer material used in the present invention provides or improves the electron injecting transporting property, the metal preferably has a small work function, in view of the electron injecting efficiency. A metal whose work function is less than 4.2 eV is preferably used. The metal whose work function is less than 4.2 eV may be preferably an alkali metal or an alkali earth metal such as Li, Ca and Mg.

Furthermore, in the second or third embodiment, in which the metal incorporated within the dendrimer material used in the present invention provides the light emitting property, the metal to be suitably used is Ir, Pt, Eu and so on, in view of capability of effecting the light emitting property.

Furthermore, in the second embodiment, the dendrimer having the charge transporting property has the charge transporting property even if it does not include a special material conventionally known as a charge transporting material. The dendrimer having the charge transporting property has a structure providing the charge transporting property. For example, it includes a structure having a conjugated system, specifically an aromatic ring such as an aromatic hydrocarbon ring, a hetero ring, and a condensed ring thereof, or an unsaturated bond and so on. Furthermore, these structure may be included in the dendrimer material, via an organic group of monovalent or more, an atom, or a linkage group which is an organic group of divalent or more capable of bonding these structures, insofar as the charge transporting property is not deteriorated.

In the present invention, the dendrimer material used for the light emitting layer includes at least a light emitting property structural unit or a metal providing the light emitting property, and may further include a charge injecting transporting structural unit. Insofar as the light emitting property and the charge transporting property are not deteriorated, another component may be included.

In the present invention, the dendrimer material used for the positive hole injecting transporting layer includes at least a positive hole injecting transporting structural unit or a metal providing the positive hole injecting transporting property, and may further include another component, insofar as the positive hole injecting transporting property is not deteriorated.

In the present invention, the dendrimer material used for the electron injecting transporting layer includes at least an electron injecting transporting structural unit or a metal providing the electron injecting transporting property, and may further another component, insofar as the electron injecting transporting property is not deteriorated.

Among them, as the dendrimer material having one or more photoreactive functional groups at the ends thereof, the azomethine dendrimer material having one or more carbazole groups at the ends thereof and one or more imino groups, which are sites allowing the coordination bond with one or more metals, in the dendrimer structure, is preferably used, in view of the compatibility between the photocurable property and the charge transporting property.

Specifically, as the positive hole injecting transporting layer, there are preferably used an azomethine dendrimer material having one or more carbazole groups at the ends thereof, represented by the following formulae (2) to (6) from among the formula (1), or dendrimer materials in which one or more azomethine groups included in the azomethine dendrimer materials listed in the following table are coordinated with one or more metals such as Sn or Eu, especially coordinated with 1 to 3 atoms of Sn.

Furthermore, specifically, as the electron injecting transporting layer, there are preferably used an azomethine dendrimer material having one or more carbazole groups at the ends thereof, represented by the following formulae (2) to (6) from among the formula (1), or dendrimer materials in which one or more azomethine groups included in the azomethine dendrimer materials listed in the following table are coordinated with 1 to 3 metals such as Ca or Al.

Formula (2):

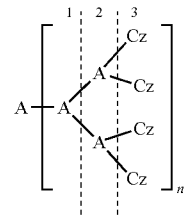

Formula (3):

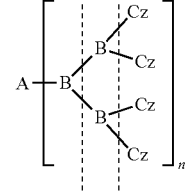

Formula (4):

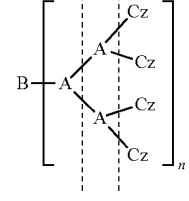

Formula (5):

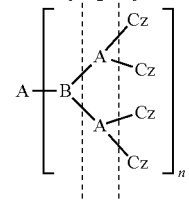

Formula (6):

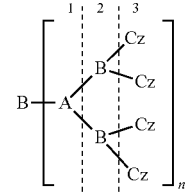

Cz: 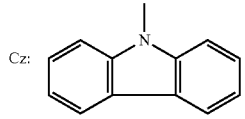

In formulae (2) to (6), A is an azomethine group (metal coordinatable group), or a linkage group including the azomethine group, B is a charge transporting structural unit or a linkage group including such a structural unit, Cz is a carbazole group. Incidentally, in formulae (2) to (6), dendrimers until the third generation are shown. Nevertheless, the generation of the dendrimer may be until the first generation or may be the forth generation or more, insofar as the dendrimer has one or more carbazole groups at the ends thereof, and includes "A".

Furthermore, the linkage group A including the azomethine group may be specifically exemplified as follows.

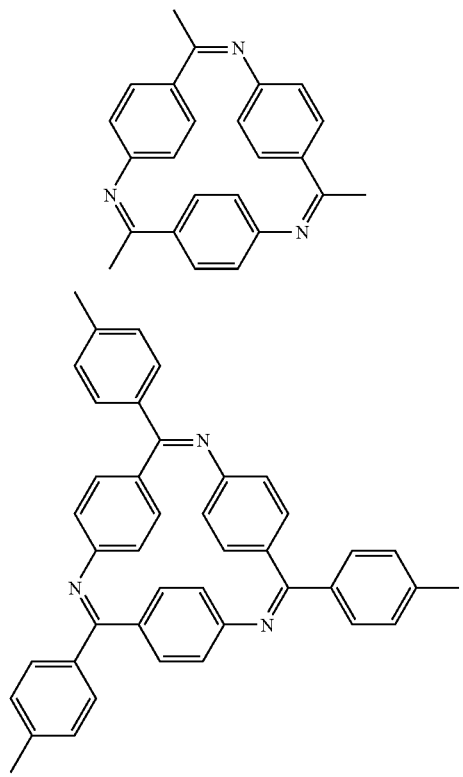

(a-1)

(a-2)

Specific examples of the azomethine dendrimer material having one or more carbazole groups at the ends thereof, represented by the formulae (2) to (6) are shown in the following table. Nevertheless, it may be not limited to these examples in any sense. Also, each bonding site of each structure shown in the table is not limited to any special site, insofar as it is the bondable site.

TABLE 1

| Structure No. | Core Molecule | First Generation | Second Generation | End Site | n |
|---|---|---|---|---|---|
| 1 | a-1 | b-1 | b-1 | Cz | 1 |
| 2 | a-2 | b-1 | b-1 | Cz | 1 |
| 3 | a-2 | b-2 | b-2 | Cz | 2 |
| 4 | b-2 | a-1 | a-1 | Cz | 1 |
| 5 | b-2 | a-2 | a-2 | Cz | 1 |
| 6 | a-1 | b-4 | b-4 | Cz | 1 |
| 7 | a-2 | b-4 | b-4 | Cz | 1 |
| 8 | a-2 | b-6 | b-6 | Cz | 1 |
| 9 | a-2 | b-7 | b-7 | Cz | 1 |
| 10 | b-7 | a-2 | b-7 | Cz | 1 |

Also, specifically, with regard to the phosphorescent light emitting layer as the light emitting layer, there is preferably used a dendrimer material in which an azomethine dendrimer material, represented by the following formula (7) from among the formula (1), having the carbazole groups at the ends thereof, is coordinated with 1 to 3 metals such as Ir or Pt.

Formula (7):

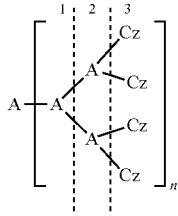

Moreover, as the charge transporting phosphorescent light emitting layer, there is preferably used a dendrimer material in which an azomethine dendrimer material, represented by the following formulae (8) to (13) from among the formula (1), having carbazole groups at the ends thereof, is coordinated with 1 to 3 metals such as Ir or Pt.

Formula (8):

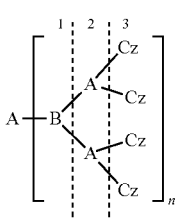

Formula (9):

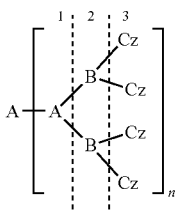

Formula (10):

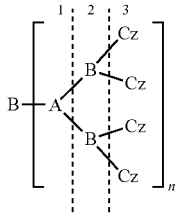

Formula (11):

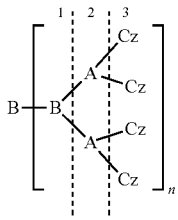

Formula (12):

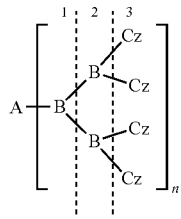

Formula (13):

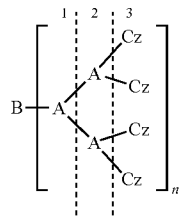

Further, as the fluorescent light emitting layer, there are preferably used an azomethine dendrimer material, represented by the following formulae (14) to (17) from among the formula (1), having carbazole groups at the ends thereof, and a dendrimer material in which such an azomethine dendrimer material is coordinated with 1 to 3 metals such as Sn.

Formula (14):

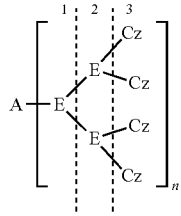

Formula (15):

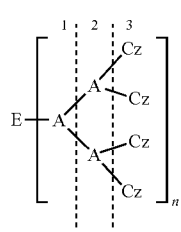

Formula (16):

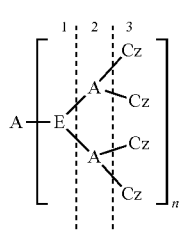

Formula (17):

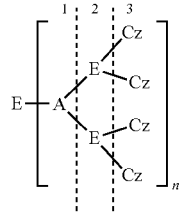

Furthermore, as the charge transporting fluorescent light emitting layer, there are preferably used an azomethine dendrimer material, represented by the following formulae (18) to (23) from among the formula (1), having carbazole groups at the ends thereof, and a dendrimer material in which such an azomethine dendrimer material is coordinated with 1 to 3 metals such as Sn.

Formula (18):

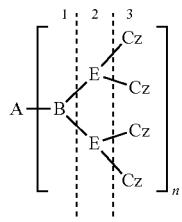

Formula (19):

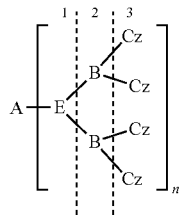

Formula (20):

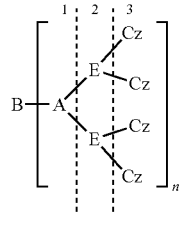

Formula (21):

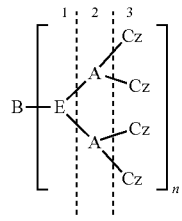

Formula (22):

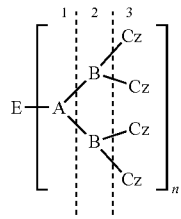

Formula (23):

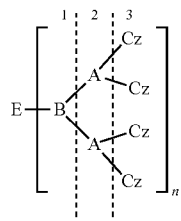

Specific examples of the azomethine dendrimer material having carbazole groups at the ends thereof, represented by the formulae (7) to (23) are shown in the following table. Nevertheless, it may be not limited to these examples in any sense. Furthermore, each bonding site of each structure shown in the table is not limited to any special site, insofar as it is the bondable site.

TABLE 2

| Structure No. | Core Molecule | First Generation | Second Generation | Third Generation | n | Metal (quantity) |
|---|---|---|---|---|---|---|
| 11 | a-1 | e-1 | e-1 | Cz | 1 | — |
| 12 | a-2 | e-2 | e-2 | Cz | 1 | — |
| 13 | a-2 | e-4 | e-4 | Cz | 1 | — |
| 14 | e-5 | a-2 | e-5 | Cz | 1 | — |
| 15 | a-2 | e-2 | a-2 | Cz | 2 | — |
| 16 | a-2 | b-1 | e-4 | Cz | 1 | — |
| 17 | a-2 | e-4 | b-1 | Cz | 1 | — |
| 18 | b-2 | e-2 | a-2 | Cz | 1 | — |
| 19 | e-1 | a-2 | b-1 | Cz | 1 | Sn (3) |
| 20 | a-2 | a-2 | b-7 | Cz | 1 | Ir (3) |

Incidentally, these dendrimer materials can be prepared according to a description of the aforementioned document, "Nature", (2002), Vol. 415, p. 509-511.

<Cured Film Having a Predetermined Pattern and a Cured Dendrimer Material Having One or More Photoreactive Functional Groups at the Ends Thereof>

In organic layers included in the organic EL device according to the present invention, at least one layer is made of a cured film having a predetermined pattern and containing a cured dendrimer material having one or more photoreactive functional groups at the ends thereof.

The cured film having a predetermined pattern and containing a cured dendrimer material having one or more photoreactive functional groups at the ends thereof is a cured film having a predetermined pattern obtained by curing a photocurable material containing the dendrimer material having one or more photoreactive functional groups at the ends thereof. The cured dendrimer material having one or more photoreactive functional groups at the ends thereof has a decreased solubility to a solvent by causing a photoreaction among the dendrimer materials each having one or more photoreactive functional groups at the ends thereof, resulting in polymerization or cross-linkage thereof. Also, an additive such as a photopolymerization initiator required for the photoreaction may be included in the photocurable material, as appropriate.

The cured film having a predetermined pattern is preferably obtained in such a manner that a dendrimer material layer is formed from a coating liquid containing the dendrimer material having one or more photoreactive functional groups at the ends thereof and an organic solvent, and then the dendrimer material layer is subjected to a pattern-exposure. In order to obtain the cured film of the invention, a process of forming the dendrimer material layer from the coating liquid containing the dendrimer material having one or more photoreactive functional groups at the ends thereof and an organic solvent, and a process of pattern-exposing the dendrimer material layer may be sufficiently employed, in the production method as mentioned later. These processes will be discussed further in detail with the explanation of the production method.

The cured film having a predetermined pattern and containing a cured dendrimer material having one or more photoreactive functional groups at the ends thereof may be a cured product of two or more kinds of dendrimer material having one or more photoreactive functional groups at the ends thereof, or may be a layered structure of two or more layers of the cured dendrimer material having one or more photoreactive functional groups at the ends thereof.

The organic layer made of the cured film having a predetermined pattern and containing the cured dendrimer material as mentioned above may be a positive hole injecting transporting layer, may be an electron injecting transporting layer, may be a light emitting layer, or may be a light emitting layer also acting as the charge injecting transporting layer. All organic layers included in the organic EL device of the present invention are preferably organic layers comprising the cured film having a predetermined pattern and the cured dendrimer material, in view of obtaining a high resolution organic EL device easily and at a low cost.

If at least one layer composing the organic layers is made of the cured film having a predetermined pattern and containing the cured dendrimer material, a light emission (electroluminescence) can be obtained at a predetermined pattern the same as that of the cured film, regardless of the function or kind of the organic layer. That is, a light emission or electroluminescence can be obtained at a predetermined pattern including a letter or design, owing to the predetermined pattern of the cured film.

Particularly, it is especially preferable that the positive hole injecting transporting layer is the cured film having a predetermined pattern and containing the cured dendrimer material having one or more photoreactive functional groups at the ends thereof. In this case, it is possible to produce an organic EL device by a wet film forming method consistently under inert atmosphere, without using the conventional troublesome aqueous or acidic material such as PEDOT:PSS. Furthermore, the cured film having a predetermined pattern and containing the cured dendrimer material having one or more photoreactive functional groups at the ends thereof has a superior positive hole injecting transporting property. From these advantages, it is possible to obtain an organic EL device having a superior light emitting property. Furthermore, in order to produce an organic EL display panel, it is required that edges of the positive hole injecting transporting layer are wiped off, for a convenience of a sealing process. Nevertheless, by employing the cured film having a predetermined pattern and containing the cured dendrimer material as the positive hole injecting transporting layer, such a need of the wiping process is eliminated. Therefore, a contamination due to the wiping process is avoided, and the production process is simplified.

Furthermore, if the light emitting layer is the cured film having a predetermined pattern and containing the cured dendrimer material having one or more photoreactive functional groups at the ends thereof, it is possible to combine light emitting layers for emitting different colors and thereby obtain a multi-color light emission. That is, because the cured film having a predetermined pattern can have a pattern or patterns for multi-color, for example, a pattern for red color, a pattern for green color, a pattern for blue color and a pattern for another color. In this case, a full color or multi-color display can be produced.

If the organic EL device of the present invention includes the organic layers other than an organic layer made of the cured film having the predetermined pattern and containing the cured dendrimer material, the organic layers may be formed by a conventional method as mentioned below.

(1) Light Emitting Layer

The light emitting layer 4 as an organic layer is a layer having a function of providing a re-combination field of an electron and a positive hole to emit a light.

Particularly, in the case that one or more patterns for multi-color are required, the light emitting layer is preferably made of the cured film having a predetermined pattern and containing the cured dendrimer material having one or more photoreactive functional groups at the ends thereof, in view of obtaining a highly minute and precise pattern easily.

The light emitting material is not limited to any special material insofar as it is a generally used material, but may be a colorant-based light emitting material, a metallic complex-based light emitting material, a polymer-based light emitting material and so on.

The colorant-based light emitting material may be for example a cyclopentadiene derivative, a tetraphenylbutadiene derivative, a triphenyl amine derivative, an oxadiazole derivative, a pyrazoloquinoline derivative, a distyrylbenzene derivative, a distyrylarylene derivative, a silole derivative, a thiophene derivative, a pyridine ring compound, a perinone derivative, a perylene derivative, an oligothiophene derivative, a trifumaryl amine derivative, an oxadiazole dimer, a pyrazolline dimer and so on.

The metallic complex-based light emitting material may be a metallic complex having a central metal such as Al, Zn, Be, or a rare earth metal such as Tb, Eu, Dy and a ligand such as oxadiazole, thiadiazole, phenylpyridine, phenylbenzoimidazole, quinoline structure, for example an alminoquinolinol complex, a benzoquinolinol beryllium complex, a benzooxazole zinc complex, a benzothiazole zinc complex, an azomethyl zinc complex, porphyrin zinc complex, an europium complex and so on.

The polymer-based light emitting material may be for example a polyparaphenylenevinylene derivative, a polythiophene derivative, a polyparaphenylene derivative, a polysilane derivative, a polyacetylene derivative, a polyvinyl carbazole, a polyfluorenone derivative, a polyfluorene derivative, a polyquinoxaline derivative, and a copolymer thereof and so on.

An additive such as a doping agent or the like may be added into the light emitting layer, for improving the light emitting efficiency or changing the light emitting wavelength. The doping agent may be for example a perylene derivative, a coumarin derivative, a rubrene derivative, a quinacridone derivative, a squalium derivative, a porphyrin derivative, a styryl colorant, a tetracene derivative, a pyrazolline derivative, a decacylene, a phenoxazone, a quinoxaline derivative, a carbazole derivative, a fluorene derivative and so on. Furthermore, as a dopant, an organic compound having the following formula may be used, for example, including an organometallic complex having a heavy metal ion as a center and exhibiting a phosphorescence, such as Ir(ppy)$_3$ (tris (2-phenylpyridine) iridium(III)), (ppy)$_2$Ir(acac) (bis(2-phenylpyridine)iridium(III) acetylacetonate), Ir(BQ)$_3$, (BQ)$_2$Ir(acac), Ir(THP)$_3$, (THP)$_2$Ir(acac), Ir(BO)$_3$, (BO)$_2$Ir(acac), Ir(BT)$_3$, (BT)$_2$Ir(acac), Ir(BTP)$_3$, (BTP)$_2$Ir(acac), PtOEP (2,3,7,8,12,13,17,18-Octaethyl-21H,23H-porphyrin platinum (II)) and so on. Among them, Ir(ppy)$_3$ is a useful compound as a low molecular carrier transporting material or a component for the organic light emitting layer.

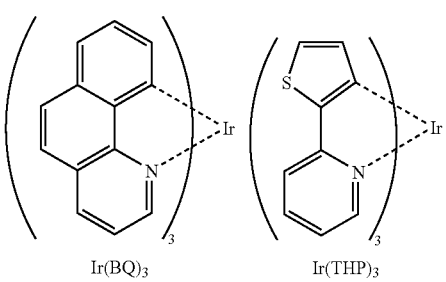

Ir(BQ)$_3$    Ir(THP)$_3$

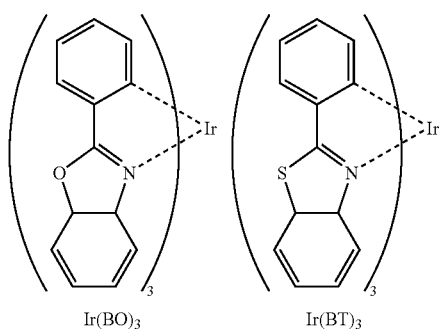

Ir(BO)$_3$    Ir(BT)$_3$

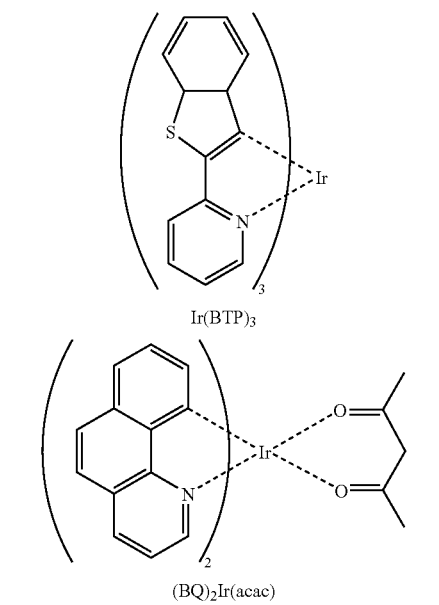

Ir(BTP)$_3$ (BQ)$_2$Ir(acac)

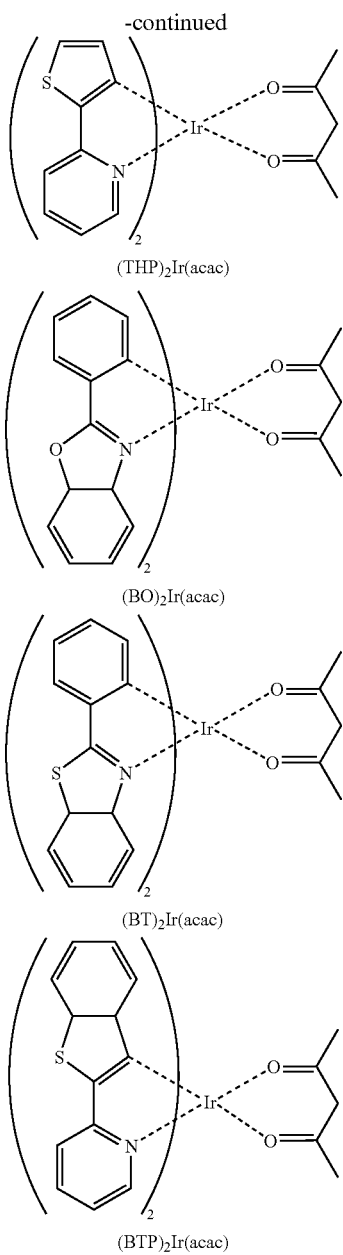

(THP)$_2$Ir(acac)

(BO)$_2$Ir(acac)

(BT)$_2$Ir(acac)

(BTP)$_2$Ir(acac)

In the present invention, as a material for the light emitting layer, there may be used any of a low or high molecular compound capable of causing a fluorescence, and a low or high molecular compound capable of causing a phosphorescence. In the case that the light emitting layer is formed by a wet film forming method, it is possible to use preferably a high molecular compound capable of causing a fluorescence or a high molecular compound including a low molecular compound capable of causing a fluorescence, or a high molecular compound capable of causing a phosphorescence or a high molecular compound including a low molecular compound capable of causing a phosphorescence.

A film thickness of the light emitting layer is not limited to any thickness insofar as the thickness can provide a re-combination field of an electron and a positive hole and causing a luminescence, but may be in the order of 1 nm to 200 nm, for example.

A method of forming the light emitting layer in the case that the general materials mentioned above are employed is not limited to any method, but may be a wet film forming method or a dry process such as a deposition process. In the present invention, the light emitting layer is preferably formed by a wet film forming method, for a purpose of taking merits of the wet film forming method. The wet film forming method may be a coating method such as a spin coating method, a casting method, a dipping method, a bar coating method, a blade coating method, a roll coating method, a gravure coating method, a flexographic printing method, a spray coating method, a die coating method or the like, or a method of patterning such as printing, an ink jet method or the like, using a molten liquid, a solution or a solution mixture of materials. Among them, the spin coating and the ink jet method are preferable.

(2) Positive Hole Injecting Transporting Layer

The positive hole injecting transporting layer 3 is a layer capable of stably transporting a positive hole injected from the anode 2 into the light emitting layer 4. The positive hole injecting transporting layer 3 may be a single layer or may be multiple layers. For example, the positive hole injecting transporting layer 3 may be disposed between the light emitting layer 4 and the anode 2, as shown in FIG. 1.

The positive hole injecting transporting layer 3 is preferably made of a cured film having a predetermined pattern and containing a cured dendrimer material having one or more photoreactive functional groups at the ends thereof, in view of obtaining an organic EL device having a superior light emitting property and allowing a production of the organic EL device by a wet film forming method consistently under inert atmosphere, without using the aqueous or acidic material as mentioned above. From the aforementioned reason, the layer 3 is preferably made of the cured film containing the cured dendrimer material having one or more photoreactive functional groups at the ends thereof, even if not including the predetermined pattern.

In the present invention, however, the layer 3 may be formed from other materials. These other materials are not limited to any special materials insofar as they can stably transport the positive hole injected from the anode into the light emitting layer, but materials compatible with a wet film forming method are preferably selected. For example, in addition to compounds exemplified as the light emitting materials for the light emitting layer, there may be used phenyl amine series, starburst type amine series, phthalocyanine series, an oxide such as a vanadium oxide, a molybdenum oxide, a ruthenium oxide, an aluminum oxide and so on, derivatives of amorphous carbon, polyaniline polythiophene, polyphenylenevinylene and so on. Specifically, there may be used bis(N-(1-naphthyl-N-phenyl)benzene (α-NPD), 4,4,4-tris(3-methylphenylphenylamino) triphenylamine (MT-DATA), poly-3,4-ethylenedioxythiophene-polystylenesulfonic acid (PEDOT-PSS), polyvinylcarbazole (PVCz) and so on.

A film thickness of the positive hole injecting transporting layer is preferably 0.1 nm to 100 nm, more preferably 0.1 nm to 20 nm, in view of the positive hole injecting transporting efficiency.

Incidentally, a method for forming the positive hole injecting transporting layer, in the case that the general materials listed above are employed, may be a wet film forming method or a dry process such as a deposition method, similarly to the case of forming the light emitting layer as mentioned above, but the wet film forming method is preferable.

(3) Electron Injecting Transporting Layer

The electron injecting transporting layer 5 is a layer capable of stably transporting an electron injected from the cathode 6 into the light emitting layer 4. The electron injecting transporting layer may be a single layer, or may be multiple layers. For example, the electron injecting transporting layer 5 may be disposed between the light emitting layer 4 and the cathode 7, as shown in FIG. 1.

Materials for forming the electron injecting transporting layer are not limited to any special materials insofar as they can stably transport the electron injected from the cathode into the light emitting layer, but materials compatible with a wet film forming method are preferably selected. Particularly, as a material for forming an organic electron transporting layer, there may be used, for example, a material typically forming a stable radical anion and having a high ionization potential, such as oxadiazoles, an aluminum quinolinol complex and so on. Specifically, there may be listed 1,3,4-oxadiazole derivatives, 1,2,4-triazole derivatives, imidazole derivatives and so on. Also there may be listed BCP (bathocuproin), or Bpehn (bathophenanthroline). A film thickness of such an electron transporting layer is preferably 1 nm to 1 μm.

Furthermore, as the electron injecting transporting layer, a metal doped layer can be formed by doping an alkali metal or an alkali earth metal into an electron transporting organic material. The electron transporting organic material may be BCP (bathocuproin), Bpehn (bathophenanthroline) and so on. The dope metal material may be Li, Cs, Ba, Sr and so on. A mole ratio of the electron transporting organic material to the metal in the metal doped layer is in the order of 1:1~1:3, preferably in the order of 1:1~1:2. A thickness of the electron injecting transporting layer made of such a metal doped layer is in the order of 5 to 500 nm, preferably in the order of 10 to 100 nm, in view of the high electron mobility, and the high optical transparency in comparison with a layer made of metal.

Incidentally, a method for forming the electron injecting transporting layer, in the case that the general materials mentioned above are employed, may be a wet film forming method or a dry process such as a deposition method, similarly to the case of forming the light emitting layer as mentioned above, but the wet film forming method is preferable.

2. Electrode (1) Anode

The anode 2 is required to be made of a transparent material if light is taken from the substrate 1 side. The anode 2 disposed at the light emitting layer side of the substrate 1 acts so as to inject a positive hole into the light emitting layer 4.

The anode 2 composing the organic EL device of the present invention is not limited to any special material insofar as it is a conductive material, but may be made of, for example, a metal such as Au, Ta, W, Pt, Ni, Pd, Cr, Cu, Mo and so on, or an oxide or alloy of these metals, or a layered structure of these metal materials. Furthermore, there may be used a conductive inorganic oxide such as In—Sn—O(ITO), In—Zn—O, Zn—O, Zn—O—Al, Zn—Sn—O and so on, or α-Si, α-SiC and the like. Furthermore, a molten metal, a metallic microparticle, and a conductive polymer may be used with a wet film forming method.

Since the anode 2 acts so as to supply the positive hole to the organic layer, a conductive material whose work function is large is preferably used for the anode. Particularly, it is preferably made of at least one kind of metals whose work function is 4.2 eV or more, or made of an alloy of these metals, or made of at least one kind of materials included in a group consisting of conductive inorganic oxides. Furthermore, the metal used for the anode preferably has the work function whose value is 4.5 eV or more, because the metal tends to be oxidized at a value less than 4.5 eV.

A thickness of the anode 2 is preferably within a range of 40 to 500 nm, depending on a kind of material. If the thickness of the anode 2 is less than 40 nm, an electrical resistance may increase, and if the thickness of the anode 2 is beyond 500 nm, a difference in level existing an edge of the patterned anode 2 may cause a crack or breakage of layers formed over the anode 2, such as the positive hole injecting transporting layer 3, the light emitting layer 4, the electron injecting transporting layer 5, and the cathode 7, or may cause a short circuit between the anode 2 and the cathode 7.

(2) Cathode

The cathode 7 is not limited to any special material insofar as it can be used for a usual organic EL device, but may be made of a material for thin film electrode, such as indium titanium oxide (ITO) as listed for the anode, indium oxide, indium zinc oxide (IZO) or gold, or a magnesium alloy (MgAg etc.), aluminum or the alloy thereof (AlLi, AlCa, AlMg etc.), or silver and so on. Among them, a material whose work function is less than 4 eV is preferable for facilitating the electron injection, such as an alkali metal (e.g. Li, Na, Cs, etc.) and a halide thereof (e.g. LiF, NaF, CsF, LiCl, NaCl, CsCl, etc.), an alkali earth metal (e.g. Ca, Mg, etc.) and a halide thereof (e.g. $CaF_2$, $MgF_2$, $CaCl_2$, $MgCl_2$, etc.), and a metal such as aluminum, silver and so on, a conductive metal oxide and an alloy or mixture thereof and so on. A thickness of the cathode is preferably 0.005 to 0.5 μm in any case.

The anode 2 and the cathode 7 can be formed by a wet film forming method, in the case that a molten metal, metallic microparticle or conductive polymer compatible with the wet film forming method is employed. If other metals are employed, the anode 2 and the cathode 7 can be formed by a dry process such as sputtering, vacuum heating deposition, EB deposition, ion plating and so on.

Incidentally, a protective layer for protecting the organic EL device may be attached, after the cathode is produced. In order to use this organic EL device stably for a long time, it is preferable to attach the protective layer or protective cover for protecting the device from an external environment. The protective layer may be made of a polymer compound, a metal oxide, a metal fluoride, a metal boride, a silicon oxide, a silicon nitride and so on. Furthermore, the protective cover may be made of a glass plate, a plastic plate with a surface treatment for decreasing the water permeation. This cover is preferably laminated with the device substrate by the aid of a thermosetting resin or a photocurable resin for sealing.

3. Substrate

The substrate 1 is usually disposed at a surface of an observer's side. Therefore, this substrate is preferably as transparent as the observer easily views the light from the light emitting layer. Incidentally, the observer's side is opposite to this substrate, this substrate may be opaque.

The substrate may be a film-like resin substrate, or a glass plate with a protective film or protective plastic layer.

The resin material composing the substrate or the protective plastic material may be a fluorocarbon resin, polyethylene, polypropylene, polyvinyl chloride, polyvinyl fluoride, polystyrene, ABS resin, polyamide, polyacetal, polyester, polycarbonate, modified polyphenylene ether, polysulfone, polyarylate, polyetherimide, polyamideimide, polyimide, polyphenylene sulfide, a liquid crystalline polyester, polyethylenetelephthalate, polybutylenetelephthalate, polyethelennaphthalate, polyoxymethylene, polyethersulfone, polyetheretherketone, polyacrylate, an acrylonitrile-styrene resin, a phenol resin, an urea resin, a melamine resin, an unsaturated polyester resin, an epoxy resin, polyurethane, a silicone resin, amorphous polyolefin and so on. Other resin materials may be used insofar as they are polymer materials satisfying requirement for an organic EL device. A thickness of the substrate is usually 50 to 200 μm.

These substrates preferably have suitable gas barrier properties against moisture, oxygen and the like, depending on their individual use. A gas barrier layer against moisture, oxygen and the like may be formed on the substrate. The barrier layer may be formed by depositing an inorganic oxide such as silicon oxide, aluminum oxide, titanium oxide and so on, for example by sputtering, vacuum deposition, or physical deposition.

Thus, the structure of the organic EL device of the present invention has been discussed. Nevertheless, another functional layer different from the above listed layers may be formed, without departing from a range of the object and effect of the present invention. Such a functional layer may include a low refractive index layer, a reflection layer, a light absorption layer, a sealing agent and so on, which are used for a usual organic EL device or light emitting display. If the functional layer is included in the organic layers, the functional layer may be the cured film having a predetermined pattern and containing the cured dendrimer material having one or more photoreactive functional groups at the ends thereof.

B. Production Method of Organic EL Device

A method for producing the organic electroluminescent device of the present invention is a method for producing an organic electroluminescent device comprising an organic layer between an anode and a cathode, the anode and the cathode facing each other, and the organic layer containing at least a light emitting layer, said method comprising steps of: forming a dendrimer material layer, as at least one layer composing the organic layer, from a coating liquid containing a dendrimer material having one or more photoreactive functional groups at the ends thereof and an organic solvent; and pattern-exposing the dendrimer material layer.

According to the method for producing the organic electroluminescent device of the present invention, the cured film having a predetermined pattern can be formed because the method including a process of forming a dendrimer material layer, as at least one layer composing the organic layer, from a coating liquid containing a dendrimer material having one or more photoreactive functional groups at the ends thereof and an organic solvent; and a process of pattern-exposing the dendrimer material layer. Thereby, the predetermined pattern can be formed efficiently and insistently under inert atmosphere by a wet film forming method, without using any aqueous or acidic material.

The production method of the present invention does not need a vacuum system including an alignment mechanism and thereby allows a production by a simple manner and at a low cost, in comparison with the conventional deposition patterning. On the other hand, in comparison with a patterning method by an ink jet method, the present invention has an advantage that a structure for assisting a patterning, a pre-treatment for a substrate, or the like is not required. Further, the production method of the present invention is a preferable method for forming a highly minute and precise pattern in view of a discharge accuracy of an ink jet head. Furthermore, in comparison with the photolithography using a further photosensitive composition, the present invention allows a further simplified and lower cost production, because the present invention utilizes a photosensitivity of the positive hole injecting transporting layer itself and thereby requires no dry etching technique, resulting in simplified processes. Therefore, according to the production method of the organic EL device of the present invention, an organic EL device having a highly minute and precise pattern can be obtained relatively easily and at a low cost.

The production method of the organic EL device will now be discussed, with reference to an example as for an embodiment of the organic EL device of the present invention, as shown in FIG. 1, in which the positive hole injecting transporting layer is formed by using a process of forming a dendrimer material layer as at least one layer composing the organic layer from a coating liquid containing an organic solvent and a dendrimer material having one or more photoreactive functional groups at the ends thereof, and a process of pattern-exposing the dendrimer material layer. A method for producing other layers different from the positive hole injecting transporting layer is not limited to any special method, and a suitable method can be selected and used as appropriate.

First of all, the substrate 1 is prepared. On a surface of the substrate 1, a transparent electrode as an anode 2 is formed by any of the aforementioned methods. Then positive hole injecting transporting layer 3 is formed by using a process of forming a dendrimer material layer as at least one layer composing the organic layer from a coating liquid containing an organic solvent and a dendrimer material having one or more photoreactive functional groups at the ends thereof, and a process of pattern-exposing the dendrimer material layer, as will be described in further detail below. Furthermore, a light emitting layer 4, then an electron injecting transporting layer 5, and then a cathode 7 are formed by a method appropriately selected from the typical forming methods as mentioned above.

<Process of Forming Dendrimer Material Layer>

First of all, a coating liquid is prepared, containing an organic solvent and a dendrimer material having one or more photoreactive functional groups at the ends thereof. The dendrimer material has been explained above, and thereby a further explanation is omitted here.

The organic solvent is not limited to any solvent insofar as the dendrimer material can dissolve in it, but may be preferably a solvent containing no water, i.e. non-aqueous solvent, in view of conducting all the processes consistently under inert atmosphere. For example, the non-aqueous solvent may be an aromatic solvent such as benzene, toluene, isomers of xylene and the mixture thereof, or mesitylene, tetralin, p-cymene, cumene, ethylbenzene, diethylbenzene, butylbenzene, chlorobenzene, isomers of dichlorobenzene, and the mixture thereof; an ether solvent such as anisole, phenetole, butylphenylether, tetrahydrofuran, 2-butanone, 1,4-dioxane, diethylether, diisopropylether, diphenylether, dibenzylether, diglym and so on; a chlorinated solvent such as dichloromethane, 1,1-dichloroethane, 1,2-dichloroethane, trichloroethylene, tetrachloroethylene, chloroform, carbon tetrachloride, 1-chloronaphthalene; cyclohexanone and so on. The organic solvent to be used may be a mixed solvent of two or more kinds.

In the coating liquid containing the organic solvent and the dendrimer material having one or more photoreactive functional groups at the ends thereof, other components may be contained. For example, an additive for initiating a photoreaction may be contained.

The method for forming the dendrimer material layer from the coating liquid may be a wet film forming method. In this process, the coating liquid may be applied on an entire surface within the predetermined area without patterning. Therefore, the wet film forming method may be a coating method including a spin coating, a casting, a dipping, a bar coating, a blade coating, a roll coating, a gravure coating, a flexographic printing, a spray coating and so on. Among them, the spin coating is preferable, in view of simplicity.

<Process of Pattern-Exposing>

The process of pattern-exposing the dendrimer material layer may be an exposing method via a photo mask, a selective irradiating method with laser, and so on. Among them, the exposing method via a photo mask is preferably used, in view of the working efficiency and the energy efficiency.

The pattern-exposing is preferably conducted with using a light inducing a reaction of the photoreactive functional group, because the solubility to a solvent is decreased at the exposed portion of the dendrimer material layer due to the reaction of the photoreactive functional group, so that the patterning becomes possible.

An exposing means or device is not limited to any special one insofar as it is appropriately selected depending on the photoreactive functional group of the dendrimer. Nevertheless, for example, the exposure may be done by using a UV lamp such as a mercury lamp or a halogen lamp, or by using an electron beam irradiation device, and so on.

By pattern-exposing the dendrimer material layer, the solubility to a solvent is decreased at the exposed predetermined pattern portion, while a solubility to a solvent is maintained at an unexposed unnecessary pattern portion.

Furthermore, it is preferable to include a process of removing the unexposed portion, after the process of pattern-exposing the dendrimer material layer. Because a necessary predetermined pattern only can be left.

Furthermore, as the process of removing the unexposed portion, a solvent developing is preferable, in view of utilizing the difference of the solubility between the exposed portion and the unexposed portion. By developing the dendrimer material layer using a solvent after the pattern-exposing process, the unexposed unnecessary pattern portion whose solubility is maintained is dissolved in the solvent and then removed, while the necessary predetermined pattern whose solubility is decreased is left.

The solvent to be used for the solvent developing after the pattern-exposing process is not limited to any special solvent, insofar as it is a good solvent for the dendrimer material used for the dendrimer material layer. A solvent used for preparing the coating liquid may be used also for this purpose. The solvent used for the solvent developing process is preferably an organic solvent, especially non-aqueous organic solvent, in view of avoiding the influence of the residue moisture.

A method for conducting the solvent developing is not limited to any special method, insofar as the solvent can contact the surface of the dendrimer material layer after the patterning, but may be a coating method such as a spin coating, a casting, a dipping, a bar coating, a blade coating, a roll coating, a gravure coating, a flexographic printing, a spray coating and so on, an ink jet method or the like. Among them, the spin coating of applying the solvent on the dendrimer material layer is preferable, in view of simplicity.

The method for producing the organic EL device will now be discussed, with reference to an example as for an embodiment of the organic EL device of the present invention, as shown in FIG. 2, in which the light emitting layer is formed by using a process of forming a dendrimer material layer as at least one layer composing the organic layers from a coating liquid containing an organic solvent and a dendrimer material having one or more photoreactive functional groups at the ends thereof, and a process of pattern-exposing the dendrimer material layer, so that three different color patterns are formed. A method for producing other layers different from the light emitting layer is not limited to any special method, and a suitable method can be selected and used as appropriate.

First of all, the substrate 1 is prepared. On a surface of the substrate 1, a transparent electrode as an anode 2 is formed by a method as mentioned above. Then the positive hole injecting transporting layer 3 is formed by a known method as mentioned above. Then, the light emitting layer 4 (1, 2, 3) is formed by using a process of forming a dendrimer material layer as at least one layer composing the organic layers from a coating liquid containing an organic solvent and a dendrimer material having one or more photoreactive functional groups at the ends thereof, a process of pattern-exposing the dendrimer material layer, and then conducting a solvent developing.

Here, in order to form three different color patterns, three different color coating liquids (a first coating liquid, a second coating liquid, a third coating liquid) are prepared, each of which contains an organic solvent and a dendrimer material having one or more photoreactive functional groups at the ends thereof. Then, firstly, a first dendrimer material layer is formed by using the first coating liquid. Then, after the first dendrimer material layer is pattern-exposed, it is subjected to a solvent developing, so that a light emitting layer 4 (1) having a first pattern for a first color is formed. Then, a second dendrimer material layer is formed by using the second coating liquid. Then, after the second dendrimer material layer is pattern-exposed, it is subjected to a solvent developing, so that a light emitting layer 4 (2) having a second pattern for a second color is formed. Furthermore, a third dendrimer material layer is formed by using the third coating liquid.

Then, after the third dendrimer material layer is pattern-exposed, it is subjected to a solvent developing, so that a light emitting layer 4 (3) having a third pattern for a third color is formed.

Then, the electron injecting transporting layer 5, and then the cathode 7 are formed by a known method as mentioned above.

Thus, the present invention has been discussed about the organic EL device and the production method thereof. Nevertheless, the present invention is also applicable to LECs (Light-emitting Electrochemical Cell) or ECL (Electro Chemi Luminescence), which are organic light emitting devices other than the organic EL device.

EXAMPLES

The present invention will now be discussed further in detail with reference to their examples. Nevertheless, the present invention is not limited to the following examples.

Example 1

Preparation of Coating Liquid for Positive Hole Injecting Transporting Layer and Light Emitting Layer The third generation azomethine dendrimer (see the following formula) having carbazole groups at the ends, disclosed in "Kanagawa Academy of Science and Technology (KAST) Summary of Studies in 2001", KAST, 2002, p 101-116, is dissolved into toluene (special grade), which is from KANTO CHEMICAL CO., INC., Tokyo, at 2% by weight, so that a coating liquid for the positive hole injecting transporting is obtained.

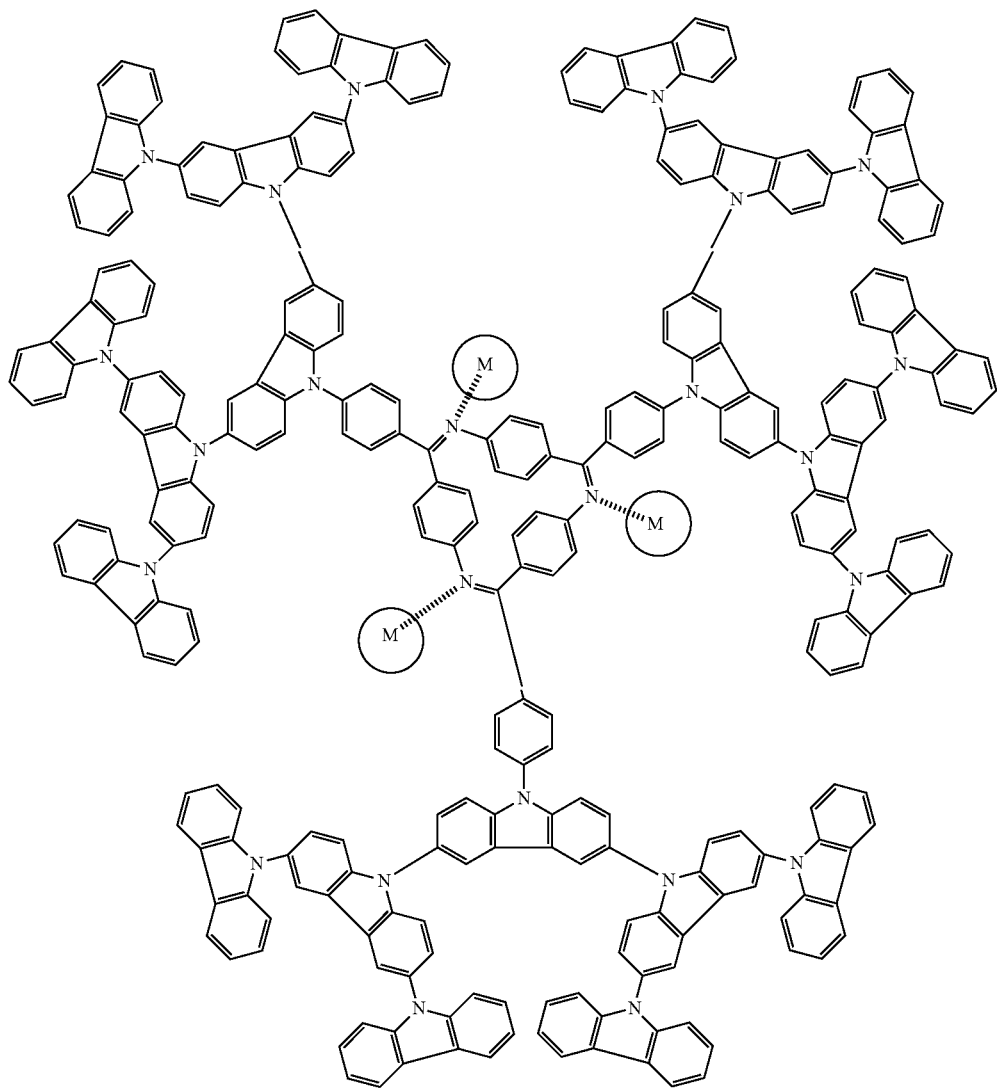

Similarly, a green fluorescent polymer material ADS 228 GE from ADS is dissolved into toluene (special grade), which is from KANTO CHEMICAL CO., INC., Tokyo, at 1.5% by weight, so that a coating liquid for the light emitting layer is obtained.

(Production of Organic Electroluminescence Device)

The following processes for producing the device area all conducted within a glove box under inert gas atmosphere.

A glass substrate on which an ITO thin film is formed is washed with a detergent and UV plasma. Then, the coating liquid for the positive hole injecting transporting layer is applied over an entire surface of the ITO thin film by a spin coating so as to become 50 nm in thickness after drying, and then dried for 30 minutes on a hot plate at 140° C.

Then, an exposure is conducted at the energy amount 5 $J/m^2$, on 365 nm wavelength basis, by using an UV lamp via a mask in order to form a desired pattern. After that, toluene (special grade), which is from KANTO CHEMICAL CO., INC., Tokyo, is spin-coated by a spin coating so as to conduct the solvent developing, so that a desired positive hole injecting transporting layer (azomethine dendrimer having a carbazole group) pattern is formed.

Furthermore, the aforementioned coating liquid for the light emitting layer is applied over an entire surface of the substrate, onto which the pattern is formed, so as to become 60 nm in thickness after drying, and then dried for 30 minutes on a hot plate at 140° C.

Then, 10 nm thickness of calcium, 200 nm thickness of aluminum over the calcium layer are vacuum-deposited. The device is sealed with a sealing glass, so that an organic electroluminescent device is obtained.

Comparative Example 1

As a positive injecting transporting layer, instead of the azomethine dendrimer pattern having a carbazole group, (ethylene dioxy thiophene)/poly(stylenesulfonate), which is an aqueous material from Bayer represented by the following formula and referred to as a general name "PEDOT:PSS", or as a commercial name "Baytron P", is used to form a film outside of the glove box without exposure. Excluding the above differences, an organic electroluminescent device is produced by the method the same as Example 1.

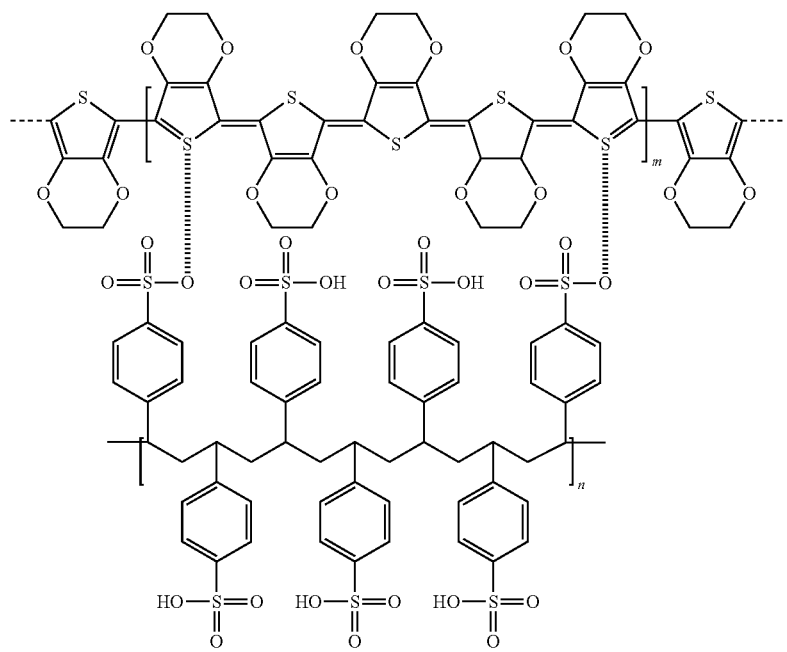

<Evaluation of Luminescence of Organic Electroluminescent Device>

The obtained organic electroluminescent devices are connected to an electrical power source and a light emitting property of each device is evaluated. As the result, the device of Example 1 of the present invention was able to obtain the luminous efficiency 1.1 times than that of the device of Comparative Example 1. Furthermore, with regard to the luminous life (determined by measuring the brightness half life of an initial value 100 nit), the device of the present invention was able to obtain the luminous life of green color 1.5 times than that of the device of Comparative Example 1.

Furthermore, it is impossible for the device of Comparative Example 1 to pattern the positive hole transporting layer by UV light. Therefore, in order to form the light emitting pattern, an independent process of patterning is required. On the other hand, it is found that a desired light emitting pattern can be formed easily, finely and at a low cost as for the device of Example produced by employing the production method of the present invention, and thereby the device of the present invention is useful.

INDUSTRIAL APPLICABILITY

The organic electroluminescent device and the production method thereof according to the present invention are applicable to various industries, including electronics for providing a high end display having a superior luminescence property and elongated life.

The invention claimed is:

1. An organic electroluminescent device comprising an organic layer between an anode and a cathode, the anode and the cathode facing each other, and the organic layer containing one or more layers that include at least a light emitting layer,
wherein at least one layer composing the organic layer comprises a film derived from an azomethine dendrimer with carbazole groups at the ends thereof in which some of the carbazole groups have at least one photoreactive functional group attached thereon and the film having a predetermined pattern.

2. The organic electroluminescent device according to claim 1, wherein the photoreactive functional group is selected from the group consisting of an acryloyl group, a methacryloyl group, a vinyl group, and a vinylcycloalkyl group.

3. The organic electroluminescent device according to claim 1, wherein the film is derived from the azomethine dendrimer and an organic solvent, pattern-exposing the azomethine dendrimer with EMF radiation to cause a reaction between the photoreactive functional group present in an exposed portion of the azomethine dendrimer, and then removing an unexposed portion thereof.

4. The organic electroluminescent device according to claim 3, wherein the film is derived by pattern-exposing the azomethine dendrimer by using at least one of a UV ray or electron beam.

5. The organic electroluminescent device according to claim 3, wherein the unexposed portion is removed by developing the same using a solvent.

6. The organic electroluminescent device according to claim 1, wherein the azomethine dendrimer has one or more sites to which one or more metals coordinate.

7. The organic electroluminescent device according to claim 1, wherein the photoreactive functional group has an ethylenically unsaturated bond.

8. An organic electroluminescent device comprising an organic layer between an anode and a cathode, the organic layer derived from an azomethine dendrimer material with carbazole groups at the ends thereof in which some of the carbazole groups have at least one photoreactive functional group attached thereon.

9. The organic electroluminescent device according to claim 8, wherein the photoreactive functional group is selected from the group consisting of an acryloyl group, a methacryloyl group, a vinyl group, a vinylcycloalkyl group, and an aryl group.

10. The organic electroluminescent device according to claim 8, wherein the azomethine dendrimer material is coordinated with 1 to 3 metals selected from the group consisting of Ag, Al, Au, Be, Bi, Co, Cr, Cu, Fe, Ga, Ir, Mo, Nb, Ni, Os, Pb, Pd, Pt, Sb, Sn, Ti, V, W, Li, Ca, Mg, Ir, Pt, and Eu.

11. The organic electroluminescent device according to claim 8, wherein the azomethine dendrimer material is selected from the group consisting of:

formula (2)

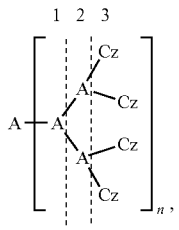

formula (3):

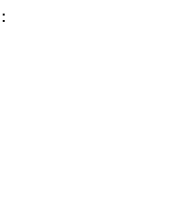

formula (4):

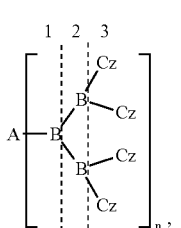

formula (5)

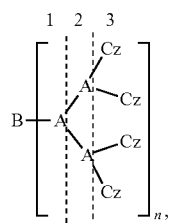

formula (6)

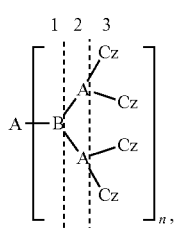

-continued formula (7)

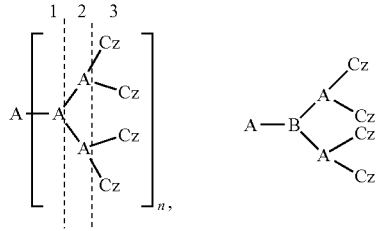

formula (8)

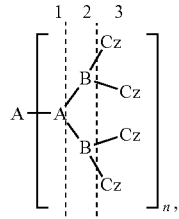

formula (9)

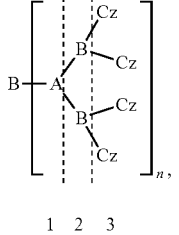

formula (10)

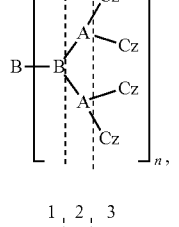

formula (11)

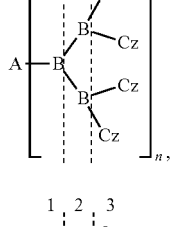

formula (12)

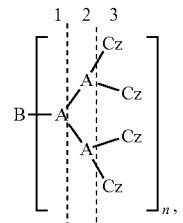

formula (13)

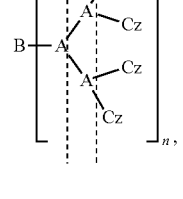

formula (14)
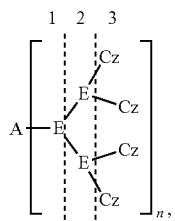
formula (15)
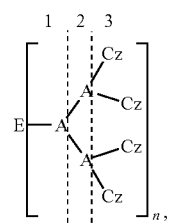
formula (16)
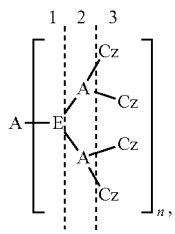
formula (17)
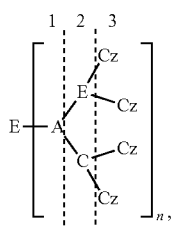
formula (18)
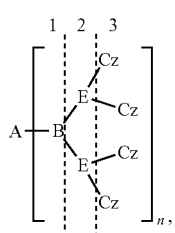
formula (19)
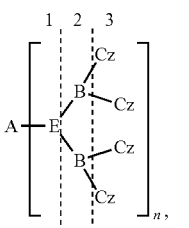
formula (20)
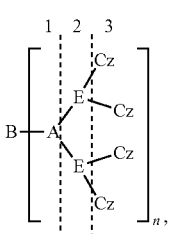
formula (21)
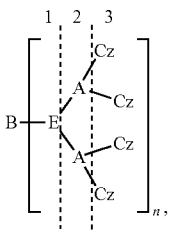
formula (22)
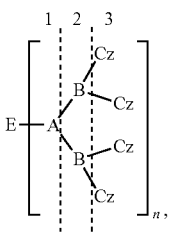
formula (23)
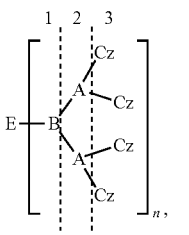
wherein (A) is an azomethine group, (B) is a charge transporting structural unit, (E) is a light emitting structural unit, "n" is 1 or a natural number more than 1, and (Cz) is carbazole
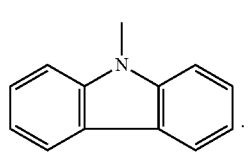

12. The organic electroluminescent device according to claim 11, wherein the azomethine group (A) is selected from the group consisting of

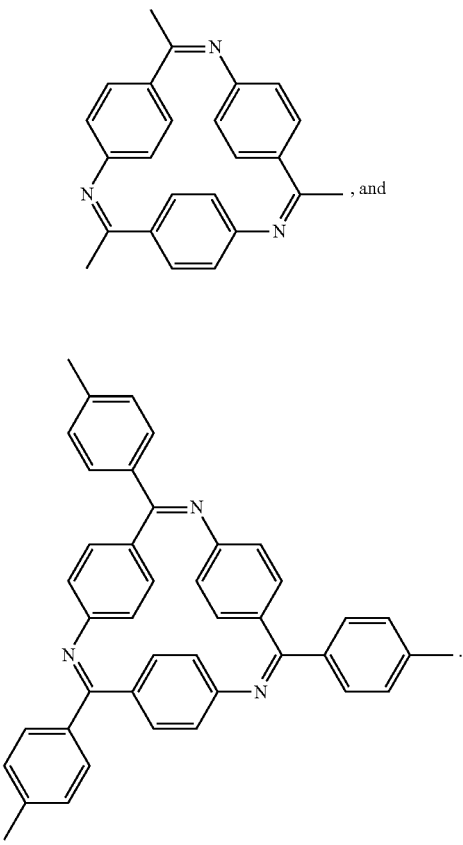

, and

13. The organic electroluminescent device according to claim 11, wherein the light emitting structural unit (E) is selected from the group consisting of:

formula (e-1)

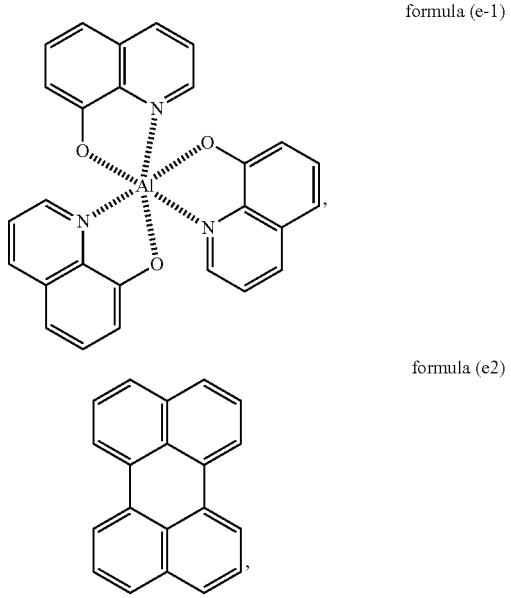

formula (e2)

formula (e-3)

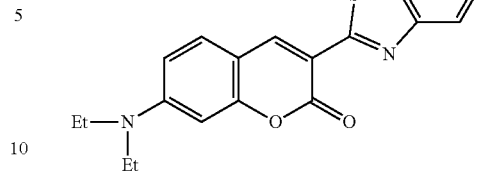

formula (e-4)

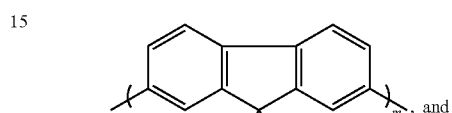

, and formula (e-5)

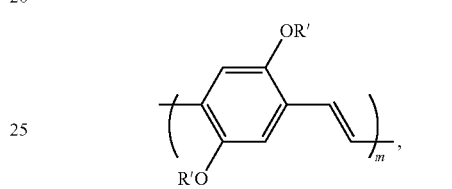

wherein each R' of the formulae (e-4) and (e-5) may be the same of different, and may be an alkyl group or an organic group including an alkyl group, Al is a metal atom, and "m" is 1 or a natural number more than 1.

14. The organic electroluminescent device according to claim 11, wherein the light emitting structural unit (E) is selected from the group consisting of a coumarin derivative, a quinolidine derivative, a quinacridone derivative, a pyrrolopyrrole derivative, a polycyclic aromatic hydrocarbon, a styryl benzene derivative, a polymethine derivative, an xanthene derivative, a cyclopentadiene derivative, a tetraphenylbutadiene derivative, a triphenyl amine derivative, an oxadiazole derivative, a pyrazoloquinoline derivative, a distyrylbenzene derivative, a distyrylarylene derivative, a silole derivative, a thiophene derivative, a pyridine ring compound, a perinone derivative, a perylene derivative, an oligothiophene derivative, a trifumaryl amine derivative, an oxadiazole dimer, a pyrazolline dimer, polyparaphenylenevinylene derivative, a polythiophene derivative, a polyparaphenylene derivative, a polysilane derivative, a polyacetylene derivative, a polyvinyl carbazole, a polyfluorenone derivative, a polyfluorene derivative, a polyquinoxaline derivative, a quinolinol metal complex derivative, a quinoline metal complex derivative, a hydroxy phenyl oxazole metal complex derivative, a hydroxy phenyl thiazole metal complex derivative, an azomethine metal complex derivative, oxadiazole metal ligand, thiadiazole metal ligand, phenylpyridine metal ligand, phenylbenzoimidazole metal ligand, quinoline metal ligand, an alminoquinolinol metal ligand, a benzoquinolinol beryllium metal ligand, a benzooxazole zinc metal complex, a benzothiazole zinc complex, an azomethyl zinc complex, porphyrin zinc complex, an europium complex.

15. The organic electroluminescent device according to claim 11, the charge transporting structural unit (B) is selected from the group consisting of Formula (b-1)

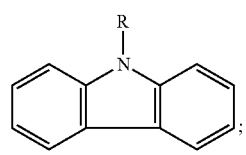

formula (b-2)

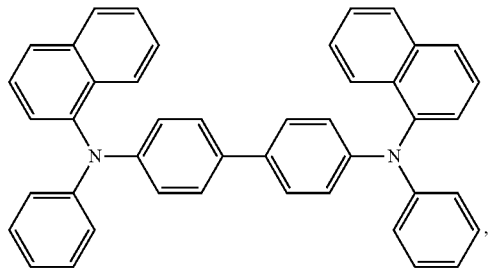

formula (b-3)

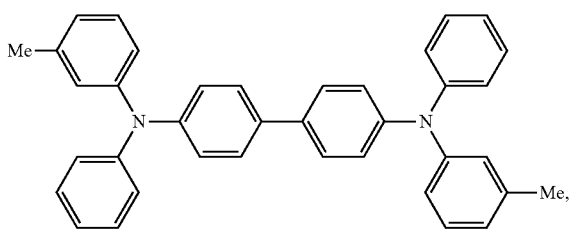

formula (b-4)

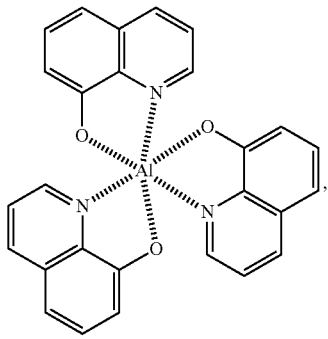

formula (b-5)

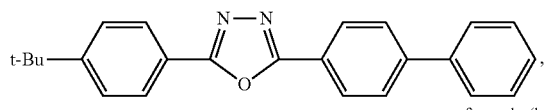

formula (b-6)

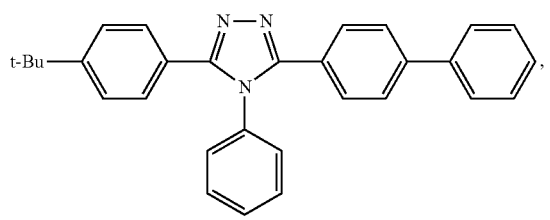

and formula (b-7)

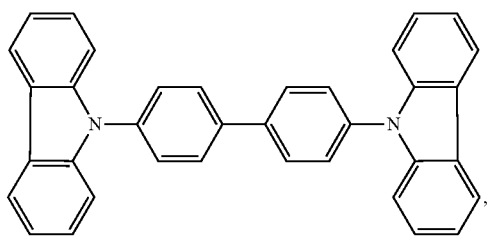

wherein R is a linkage group selected from the group consisting of a direct bond, an aryl group, and an alkyl group, and wherein Al is a metal atom.

16. The organic electroluminescent device according to claim 11, the charge transporting structural unit (B) is selected from the group consisting of a positive hole transporting material, an electron transporting material, and a positive hole/electron transporting material,
wherein the positive hole transporting material selected from carbazole, triphenyl amine, pyrazolline, a starburst polyamine and a phthalocyanine metallic complex derivative,
wherein the electron transporting material is selected from an alminoquinolinol complex derivative, an oxadiazole derivative, a triazole derivative, a triadine derivative, and a phenyl quinoxaline, and
wherein the positive hole/electron transporting material comprising a carbazole biphenyl derivative.

17. The organic electroluminescent device according to claim 8, the organic layer further comprises a doping agent selected from the group consisting of perylene derivative, a coumarin derivative, a rubrene derivative, a quinacridone derivative, a squalium derivative, a porphyrin derivative, a styryl colorant, a tetracene derivative, a pyrazolline derivative, a decacyclene, a phenoxazone, a quinoxaline derivative, a carbazole derivative, a fluorene derivative, Ir(ppy)$_3$(tris(2-phenylpyridine)iridium(III)), (ppy)$_2$Ir(acac) (bis(2-phenylpyridine)iridium(III) acetylacetonate), Ir(BQ)$_3$, (BQ)$_2$Ir(acac), Ir(THP)$_3$, (THP)$_2$Ir(acac), Ir(BO)$_3$, (BO)$_2$Ir(acac), Ir(BT)$_3$, (BT)$_2$Ir(acac), Ir(BTP)$_3$, (BTP)$_2$Ir(acac), and PtOEP (2,3,7,8,12,13,17,18-Octaethyl-21H,23H-porphyrin platinum (II)).

18. The organic electroluminescent device according to claim 8, wherein the organic layer further comprises a special material selected from the group consisting of a phenyl amine, starburst type amine, phthalocyanine, vanadium oxide, molybdenum oxide, ruthenium oxide, aluminum oxide an amorphous carbon, a polyaniline polythiophene, a polyphenylenevinylene, bis(N-(1-naphthyl-N-phenyl)benzene (α-NPD), 4,4,4-tris(3-methylphenylphenylamino) triphenylamine (MTDATA), poly-3,4-ethylenedioxythiophene-polystylenesulfonic acid (PEDOT-PSS), polyvinylcarbazole (PVCz).

19. The organic electroluminescent device according to claim 8,
wherein the cathode is composed of material selected from the group consisting of indium titanium oxide (ITO), indium oxide, indium zinc oxide (IZO), gold, a maganesium silver alloy, an AlLi alloy, an AlCa alloy, an Al Mg alloy, silver and alloys thereof, and
wherein the anode is composed of material selected from the group consisting of Au, Ta, W, Pt, Ni, Pd, Cr, Cu, Mo In—Sn—O(ITO), In—Zn—O, Zn—O, Zn—O—Al, Zn—Sn—O and so on, or a-Si, a-SiC, oxides thereof and alloys thereof.

20. The organic electroluminescent device according to claim 8, further comprising a substrate selected from the group consisting of a fluorocarbon resin, polyethylene, polypropylene, polyvinyl chloride, polyvinyl fluoride, polystylene, ABS resin, polyamide, polyacetal, polyester, polycarbonate, modified polyphenylene ether, polysulfone, polyarylate, polyetherimide, polyamideimide, polyimide, polyphenylene sulfide, a liquid crystalline polyester, polyethylenetelephthalate, polybutylenetelephthalate, polyethelennaphthalate, polyoxymethylene, polyethersulfone, polyetheretherketone, polyacrylate, an acrylonitrile-styrene resin, a phenol resin, an urea resin, a melamine resin, an unsaturated polyester resin, an epoxy resin, polyurethane, a silicone resin, and amorphous polyolefin.

* * * * *